(12) United States Patent
Inoue et al.

(10) Patent No.: US 6,627,518 B1
(45) Date of Patent: *Sep. 30, 2003

(54) METHOD FOR MAKING THREE-DIMENSIONAL DEVICE

(75) Inventors: Satoshi Inoue, Chino (JP); Tatsuya Shimoda, Suwa-gun (JP)

(73) Assignee: Seiko Epson Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 74 days.

(21) Appl. No.: 09/403,342

(22) PCT Filed: Feb. 23, 1999

(86) PCT No.: PCT/JP99/00819

§ 371 (c)(1),
(2), (4) Date: Oct. 18, 1999

(87) PCT Pub. No.: WO99/44236

PCT Pub. Date: Sep. 2, 1999

(30) Foreign Application Priority Data

Feb. 27, 1998 (JP) .......................................... 10-048410

(51) Int. Cl.[7] .......................... H01L 21/00; H01L 21/30; H01L 71/46
(52) U.S. Cl. ....................................... 438/458; 438/152
(58) Field of Search ................................ 438/149, 150, 438/151, 152, 161, 455, 458, 515; 156/344, 584; 29/426.4, 426.5, 762

(56) References Cited

U.S. PATENT DOCUMENTS

| | | | | | |
|---|---|---|---|---|---|
| 4,883,561 A | * | 11/1989 | Gmitter et al. | ............ | 156/633 |
| 5,357,122 A | * | 10/1994 | Okubora et al. | ............... | 257/44 |
| 5,625,726 A | * | 4/1997 | Ichigi | .......................... | 385/14 |
| 5,773,331 A | * | 6/1998 | Solomon et al. | ............ | 438/164 |
| 5,821,138 A | | 10/1998 | Yamazaki et al. | | |
| 5,916,585 A | * | 6/1999 | Cook et al. | .................. | 424/426 |
| 5,953,597 A | * | 9/1999 | Kusumoto et al. | .......... | 438/161 |

(List continued on next page.)

FOREIGN PATENT DOCUMENTS

| | | |
|---|---|---|
| JP | 61-99362 | 5/1986 |
| JP | A-6-291291 | 10/1994 |
| JP | 7-78938 | 3/1995 |
| JP | 8-125120 | 5/1996 |
| JP | A-8-288522 | 11/1996 |
| WO | WO 95/09438 | 4/1995 |

*Primary Examiner*—John F. Niebling
*Assistant Examiner*—Viktor Simkovic
(74) *Attorney, Agent, or Firm*—Oliff & Berridge, PLC

(57) ABSTRACT

A method for making a three-dimensional device is disclosed. The method includes a step of forming a first cleaving layer, a first intermediate layer, and a first transferred layer on a first translucent substrate and forming a second cleaving layer, a second intermediate layer, and a second transferred layer on a second translucent substrate. The method further includes a step for bonding of the first transferred layer to a transferring-side substrate on the side away from the first translucent substrate, with a first adhesive layer provided therebetween; a step for irradiating the first cleaving layer with illuminating light so as to form intralayer and/or interfacial cleavage in the first cleaving layer by ablation and then detaching the first transferred layer from the first translucent substrate to transfer the first transferred layer onto the transferring-side substrate; a step for bonding of the second transferred layer to the first transferred layer on the side away from the translucent substrate with a conductive adhesive layer provided therebetween; and a step for irradiating the second cleaving layer with the illuminating light as above, and then detaching the second transferred layer from the second translucent substrate to transfer the second transferred layer onto the first transferred layer.

29 Claims, 13 Drawing Sheets

U.S. PATENT DOCUMENTS 5,976,953 A * 11/1999 Zavracky et al. ............ 438/455
5,985,742 A * 11/1999 Henley et al. ............... 438/515
5,994,207 A * 11/1999 Henley et al. ............... 438/515
6,010,579 A *  1/2000 Henley et al. ............. 148/33.2
6,013,563 A *  1/2000 Henley et al. ............... 438/458
6,127,199 A    10/2000 Inoue et al.
6,143,582 A    11/2000 Vu et al.

* cited by examiner

METHOD FOR MAKING THREE-DIMENSIONAL DEVICE

BACKGROUND OF THE INVENTION

1. Field of the Invention

The present invention relates to a method for making a three-dimensional device.

2. Description of Related Art

In conventional processes for making three-dimensional devices such as three-dimensional ICs, a first layer including field effect transistors (FETs) is formed on an Si substrate by a multiple of steps. Next, a similar second layer is formed on the first layer. A third layer and the subsequent layers are then similarly formed thereon.

In the conventional processes for making three-dimensional devices, however, these layers are deposited on the same substrate; hence, overlying layers must be formed so as not to adversely affect the layer thereunder with various restrictions, for example, the upper temperature limit, so that the underlying layers are not affected.

When different layers are deposited, it is very difficult to produce these layers at desired device parameters, for example, gate-line width, thickness of the gate insulating film, design rule, and process conditions such as production temperature.

In addition, in the conventional methods for making three-dimensional devices, these layers are formed on a substrate constituting a device. Thus, the substrate used must have adaptability as a substrate for a device and adaptability as a substrate for forming these layers. Since usable substrates are limited, the methods are disadvantageous.

Accordingly, three-dimensional devices such as three-dimensional ICs have not been actually used.

SUMMARY OF THE INVENTION

It is an object of the present invention to provide a method for making three-dimensional devices under a wide variety of forming conditions for thin film device layers, and for facilitating production of high-performance three-dimensional devices.

Such an object is achieved by the following embodiments (1) to (22) according to the present invention.

(1) A method for making a three-dimensional device which may consist of depositing in the thickness direction a plurality of thin film device layers disposed in a predetermined region in the two-dimensional direction, wherein at least one of the thin film device layers is deposited by a transfer process.

(2) A method for making a three-dimensional device constituting a three-dimensional circuit which may consist of depositing in the thickness direction a plurality of thin film device layers constituting a circuit disposed in a predetermined region in the two-dimensional direction on a substrate, wherein at least one of the thin film device layers is deposited by a transfer process.

(3) The method for making a three-dimensional device according to (1) or (2) above, wherein the transfer process may consist of forming a thin film device layer on a first substrate with a cleaving layer provided therebetween, and irradiating the cleaving layer with illuminating light so as to form cleavage in the cleaving layer and/or at the interface thereof and to transfer the thin film device layer on the first substrate onto a second substrate side.

(4) The method for making a three-dimensional device according to (3) above, wherein the cleavage of the cleaving layer is generated by breakage or attenuation of atomic or molecular bonding force of substances constituting the cleaving layer.

(5) The method for making a three-dimensional device according to (3) above, wherein the cleavage of the cleaving layer is generated by gas evolved from the substance constituting the cleaving layer.

(6) The method for making a three-dimensional device according to any one of (3) to (5) above, wherein the illuminating light is laser light.

(7) The method for making a three-dimensional device according to (6) above, wherein the wavelength of the laser light is 100 to 350 nm.

(8) The method for making a three-dimensional device according to (6) above, wherein the wavelength of the laser light is 350 to 1,200 nm.

(9) The method for making a three-dimensional device according to any one of (3) to (8) above, wherein the cleaving layer may consist of amorphous silicon, ceramic, metal or an organic polymer.

(10) The method for making a three-dimensional device according to any one of (3) to (9) above, wherein the first substrate is a transparent substrate.

(11) The method for making a three-dimensional device according to any one of (1) to (10) above, wherein each of the thin film device layers is provided with connecting electrodes, and the connecting electrodes electrically connect the two adjacent thin film device layers.

(12) The method for making a three-dimensional device according to (11) above, wherein the connecting electrodes are disposed on the two surfaces of the thin film device layer.

(13) The method for making a three-dimensional device according to (11) or (12) above, wherein the two adjacent thin film device layers are bonded to each other with an anisotropic conductive film therebetween.

(14) The method for making a three-dimensional device according to any one of (1) to (10) above, wherein in the two selected layers among the thin film device layers, one of the two selected layers is provided with a light emitting section and the other layer is provided with a light receiving section for receiving the light from the light emitting section, the light emitting section and the light receiving section enabling optical communication between the two layers.

(15) The method for making a three-dimensional device according to any one of (1) to (14) above, wherein the thin film device layer deposited by the transfer is simultaneously produced with at least one of the other thin film device layers.

(16) The method for making a three-dimensional device according to any one of (1) to (15) above, wherein at least one of the thin film device layers has a plurality of thin film transistors.

(17) The method for making a three-dimensional device according to any one of (1) to (16) above, wherein the thin film device layers as memory are transferred a plurality of times to form a large-scale memory.

(18) The method for making a three-dimensional device according to any one of (1) to (16) above, wherein the thin film device layers as logic are transferred a plurality of times to form a large-scale logic.

(19) The method for making a three-dimensional device according to any one of (1) to (16) above, wherein the thin film device layers as memory and the thin film device layers as logic are transferred to form a system LSI.

(20) The method for making a three-dimensional device according to (19) above, wherein the logic and the memory are formed by different design rules.

(21) The method for making a three-dimensional device according to (19) above, wherein the logic and the memory are formed by different design parameters.

(22) The method for making a three-dimensional device according to (19) above, wherein the logic and the memory are formed by different production processes.

DETAILED DESCRIPTION OF PREFERRED EMBODIMENTS

A method for making a three-dimensional device in accordance with the present invention will now be described with reference to the preferred embodiments shown in the attached drawings.

In the present invention, a plurality of layers are deposited using a "transfer process (transfer technology) for a thin film structure" (described later) to make a three-dimensional device, for example, a three-dimensional IC. First, the "transfer process for a thin film structure" will be described.

FIGS. 1 to 8 are cross-sectional views of the steps in an embodiment of a transfer process for a thin film structure in accordance with the present invention. The steps of the transfer process (cleaving method) will be described based on these drawings.

Figure 1:
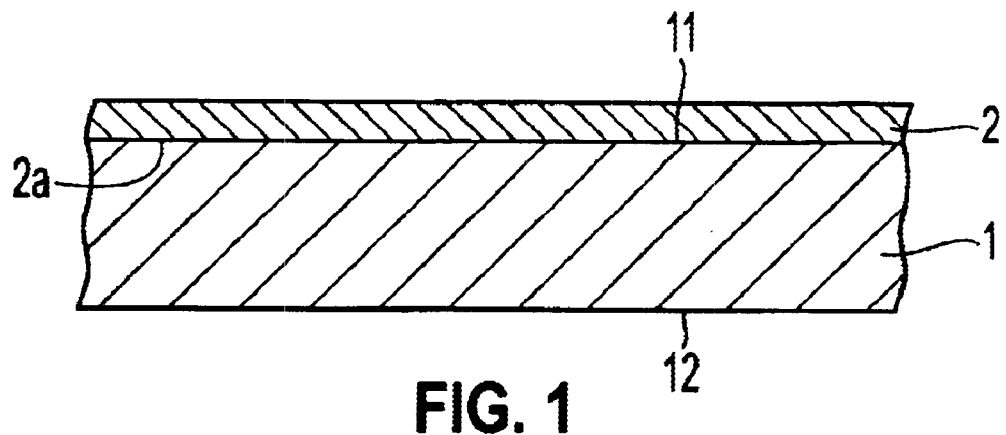
FIG. 1 is a schematic cross-sectional view of a step in an embodiment of a transfer process of a thin film structure in accordance with the present invention.

<1>As shown in FIG. 1, a cleaving layer (light absorption layer) 2 is formed on one face (cleaving layer forming face 11) of the substrate 1.

When the side of the substrate 1 is irradiated with illuminating light 7, the substrate 1 is preferably translucent so as to transmit the illuminating light 7.

The transmittance of the illuminating light 7 is preferably 10% or more, and more preferably 50% or more. An excessively low transmittance causes large attenuation (loss) of the illuminating light 7, and thus a high luminous intensity is necessary for cleavage of the cleaving layer 2.

The substrate 1 is preferably composed of a highly reliable material, and more preferably is composed of a heat resistant material. When a transferred layer 4 and an intermediate layer 3, which will be described below, are formed, a high process temperature (for example, 350 to 1,000° C.) may be required for some types of layers, and in some methods for making these layers. When the substrate 1 has high heat resistance, a wide variety of film deposition conditions such as temperature can be manipulated in the formation of the transferred layer 4 on the substrate 1.

When the maximum temperature during the formation of the transferred layer 4 is $T_{max}$, the substrate 1 is preferably composed of a material having a heat distortion point which is higher than the $T_{max}$. In detail, the materials for the substrate 1 have a heat distortion point of preferably 350° C. or more, and more preferably 500° C. or more. Examples of such materials include heat resistant glasses, such as quartz glass, soda glass, Corning 7059, and Nippon Electric Glass OA-2.

When the cleaving layer 2, the intermediate layer 3 and the transferred layer 4 are formed at low process temperatures, the substrate 1 may be composed of an inexpensive glass or synthetic resin having a low melting point.

Although the thickness of the substrate 1 is not limited, it is in a range of preferably 0.1 to 5.0 mm and more preferably 0.5 to 1.5 mm. An excessively small thickness of the substrate 1 results in decreased strength, whereas an excessively large thickness readily causes high attenuation of the illuminating light 7 when the transmittance of the substrate 1 is low. When the substrate 1 has a high transmittance for the illuminating light 7, the thickness may exceed the above range.

The thickness of the substrate 1 at the position for forming the cleaving layer is preferably uniform so as to be uniformly irradiated with the illuminating light 7.

The cleaving layer forming face 11 and the light incident face 12 of the substrate 1 is not limited to be flat as shown in the drawing and may be curved.

In the present invention, the substrate 1 is not removed by etching or the like, but is detached by cleavage of the cleaving layer 2 provided between the substrate 1 and the transferred layer 4. Thus, the operation is easy, and various materials, for example, a material having a relatively large thickness, may be used as the substrate 1.

The cleaving layer 2 will now be described.

The cleaving layer 2 absorbs illuminating light 7 described below to cause cleavage in the layer and/or at an interface 2a or 2b (hereinafter referred to as "intralayer cleavage" and "interfacial cleavage", respectively). Preferably, irradiation of the illuminating light 7 causes intralayer cleavage and/or interfacial cleavage by breakage or attenuation of atomic or molecular bonding force of substances constituting the cleaving layer 2, that is, by ablation.

Furthermore, the irradiation of the illuminating light 7 will cause cleavage by gas evolved from the cleaving layer 2 in some cases. Components contained in the cleaving layer 2 will be evolved as gas in some cases, or the vapor formed by instantaneous gasification of the cleaving layer 2 by light absorption will contribute to the cleavage in some cases.

The following are examples of compositions of the cleaving layer 2.

(1) Amorphous silicon (a—Si)

The amorphous silicon may contain hydrogen (H). The hydrogen content is preferably 2 atomic percent or more, and more preferably in a range of approximately 2 to 20 atomic percent. When a predetermined content of hydrogen is contained, hydrogen is evolved by irradiation of the illuminating light 7, and the internal pressure formed in the cleaving layer 2 yields a force inducing cleavage between the upper and lower thin films.

The hydrogen content in the amorphous silicon can be controlled by the film deposition conditions, for example, the gas composition in CVD, gas pressure, gas atmosphere, gas flow rate, temperature, substrate temperature, and input power.

(2) Oxide ceramics, dielectric (ferroelectric) materials, and semiconductors, such as silicon dioxide or silicates, titanium oxide or titanates, zirconium oxide or zirconates, and lanthanum oxide or lanthanates.

Examples of silicon oxide include SiO, $SiO_2$, and $Si_3O_2$. Silicates include $K_2SiO_3$, $Li_2SiO_3$, $CaSiO_3$, $ZrSiO_4$, and $Na_2SiO_3$.

Examples of titanium oxide include TiO, $Ti_2O_3$, and $TiO_2$. Titanates include $BaTiO_4$, $BaTiO_3$, $Ba_2Ti_9O_{20}$, $Ba_2Ti_5O_{11}$, $CaTiO_3$, $SrTiO_3$, $PbTiO_3$, $MgTiO_3$, $ZrTiO_2$, $SnTiO_4$, $Al_2TiO_5$, and $FeTiO_3$.

Zirconium oxide includes $ZrO_2$. Examples of zirconates include $BaZrO_3$, $ZrSiO_4$, $PbZrO_3$, $MgZrO_3$, and $K_2ZrO_3$.

(3) Ceramics and dielectric materials (ferroelectric materials), such as PZT, PLZT, PLLZT, and PBZT.

(4) Nitride ceramics, such as silicon nitride, aluminum nitride, and titanium nitride.

(5) Organic polymers

Any organic polymer may be used, as long as the polymer has bonds and particularly has many bonds, such as —$CH_2$—, —CO—(carbonyl), —CONH—(amido), —NH—(imido), —COO—(ester), —N=N—(azo), and —CH=N—(schif) (these bonds are broken by irradiation of the illuminating light 7). The organic polymer may contain aromatic hydrocarbon groups (at least one benzene ring or fused ring) in the chemical formula.

Examples of the organic polymers include polyolefins, such as polyethylene and polypropylene, polyimides, polyamides, polyesters, polymethyl methacrylate (PMMA), polyphenylene sulfide (PPS), polyether sulfones (PES), and epoxy resins.

(6) Metals

Examples of metals include aluminum, lithium, titanium, manganese, indium, tin, samarium, and alloys containing at least one of these metals.

The thickness of the cleaving layer 2 is determined by various factors, such as the purpose of cleavage, the composition of the cleaving layer 2, the layer configuration, and the method for forming the layer. The thickness is in a range of preferably 1 nm to 20 $\mu$m, more preferably 10 nm to 2 $\mu$m, and most preferably 40 nm to 1 $\mu$m.

An excessively small thickness of the cleaving layer 2 will inhibit formation of a uniform film and will thus cause irregular cleavage. An excessively large thickness requires a high luminous intensity of the illuminating light 7 and a long time for the subsequent removal procedure of the cleaving layer 2. It is preferable that the thickness of the cleaving layer 2 be as uniform as possible.

The method for making the cleaving layer 2 is not limited, and is determined depending on various conditions including the film composition and the film thickness. Examples of the methods include CVD processes including MOCVD, low-pressure CVD, and ECR-CVD processes; vapor deposition processes including evaporation processes, molecular beam (MB) deposition processes, sputtering processes, ion plating processes, and PVD; plating processes including electroplating, dip plating (dipping) and electroless plating processes; Langmuir-Blodgett (LB) processes; coating processes including spin coating, spray coating and roll coating processes; printing processes; transfer processes; ink jet processes; and powder jet processes. The cleaving layer 2 may be formed by combination of these processes.

For example, the cleaving layer 2 composed of amorphous silicon (a—Si) is preferably formed by a CVD process, and particularly a low-pressure CVD or plasma CVD process.

When the cleaving layer 2 is composed of a ceramic formed by a sol-gel process or an organic polymer, it is preferably formed by a coating process and particularly a spin coating process.

The cleaving layer 2 may be formed by two or more steps (for example, by a layer-forming step and an annealing step).

The cleaving layer 2 may be composed of two or more layers. The compositions of the two or more layers may be the same or different.

Figure 2:
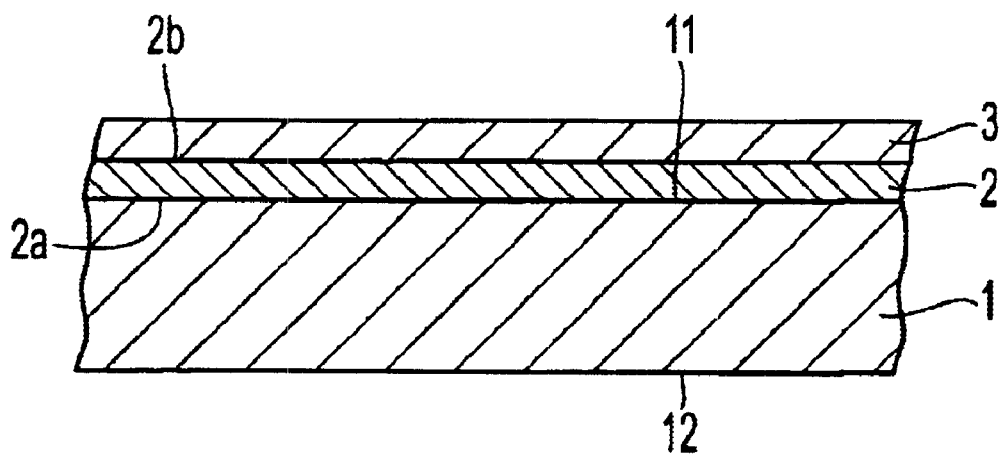
FIG. 2 is a schematic cross-sectional view of a step in an embodiment of a transfer process of a thin film structure in accordance with the present invention.

<2>As shown in FIG. 2, an intermediate layer (underlying layer) 3 is formed on the cleaving layer 2.

The intermediate layer 3 is formed for various purposes, for example, as at least one layer among a protective layer for physically or chemically protecting the below-mentioned transferred layer 4, an insulating layer, a conductive layer, a light-shielding layer for shielding the illuminating light 7, a barrier layer inhibiting migration to the transferred layer 4 or from the transferred layer 4, and a reflective layer.

The composition of the intermediate layer 3 may be determined depending on the purpose of the formation. For example, an intermediate layer 3, which is formed between an amorphous silicon cleaving layer 2 and a thin film (TFT) transferred layer 4, is composed of silicon oxide, such as $SiO_2$. An intermediate layer 3 formed between the cleaving layer 2 and a PZT transferred layer 4 is composed of a metal, e.g., platinum, gold, tungsten, tantalum, molybdenum, aluminum, chromium, or titanium, or an alloy containing such a metal.

The thickness of the intermediate layer 3 is determined depending on the purpose of the formation and the required functions. The thickness is in a range of preferably 10 nm to 5 μm and more preferably 40 nm to 1 nm.

The method for forming the intermediate layer 3 may be the same as that for forming the cleaving layer 2. The intermediate layer 3 may be formed by two or more steps.

The intermediate layer 3 includes two or more layers having the same composition or different compositions. In the present invention, the transferred layer 4 may be directly formed on the cleaving layer 2 without forming the intermediate layer 3.

Figure 3:
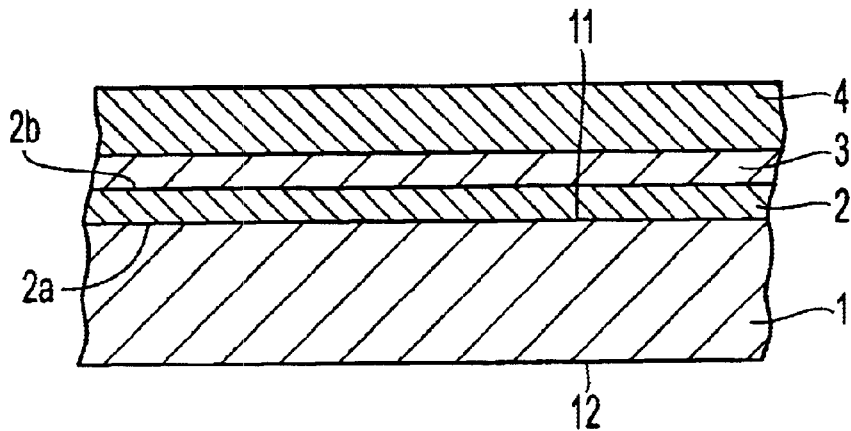
FIG. 3 is a schematic cross-sectional view of a step in an embodiment of a transfer process of a thin film structure in accordance with the present invention.

<3>As shown in FIG. 3, the transferred layer (cleaved member) 4 is formed on the intermediate layer 3.

The transferred layer 4 is the layer which is transferred onto a member 6, described below, and may be formed by the same method for forming the cleaving layer 2.

Although the purpose for the formation, the type, the shape, the configuration, the composition, and physical and chemical properties of the transferred layer 4 are not limited, it is preferably a thin film and particularly a functional thin film or a thin film device, in consideration of the purpose and usefulness of the transfer.

Examples of functional thin films and thin film devices include thin film transistors (TFTs), thin film diodes, and other thin film semiconductor devices; electrodes, e.g., transparent electrodes, such as ITO and tin oxide films; photovoltaic elements used in solar cells and image sensors; switching elements, memories; actuators such as piezoelectric elements; micromirrors, e.g., thin film piezoelectric ceramics; recording media, such as magnetic recording media, magneto-optical recording media, and optical recording media; thin film magnetic recording heads, coils, inductors, thin film high-permeability materials, and magnetic microdevices by combination thereof; optical thin films, such as filters, reflective films, dichroic mirrors, and polarizing elements;

semiconductor thin films; superconducting thin films, e.g., YBCO thin films; magnetic thin films; multilayered metallic thin films: multilayered metal-ceramic thin films; multilayered metal-semiconductor thin films; multilayered ceramic-semiconductor thin films; and multilayered thin films of organic thin films with other thin films.

Among these, applications to thin film devices, magnetic microdevices, three-dimensional microstructural configurations, actuators, and micromirrors are particularly useful and preferable.

Such functional thin films and thin film devices are formed at relatively high process temperatures in relation to the forming methods thereof. As described above, the substrate 1 must have high reliability and be durable in the process temperatures.

The transferred layer 4 may be composed of a single layer or a composite of a plurality of layers. Alternatively, the transferred layer 4 may have a predetermined pattern, as in the above thin film transistor. The formation (deposition) and patterning of the transferred layer 4 are performed by predetermined methods. Such a transferred layer 4 is generally formed by a plurality of steps.

The formation of the transferred layer 4 by the thin film transistor can be performed by the methods disclosed in Japanese Patent Publication No. 2-50630, and by H. Ohshima, et al., International Symposium Digest of Technical Papers SID 1983, "B/W and Color LC Video Display Addressed by Poly Si TFTs".

The thickness of the transferred layer 4 is not limited, and is appropriately determined depending on various conditions including the purpose of the formation, the function, the composition and properties. When the transferred layer 4 is a thin film transistor, the total thickness is preferably 0.5 to 200 μm, and more preferably 1.0 to 10 μm. In the other thin films, the preferable total thickness lies in a wider range, for example, in a range of 50 nm to 1,000 μm.

The transferred layer 4 is not limited to the above-mentioned thin film, and may be a thick film, such as a coating film or a sheet.

Figure 4:
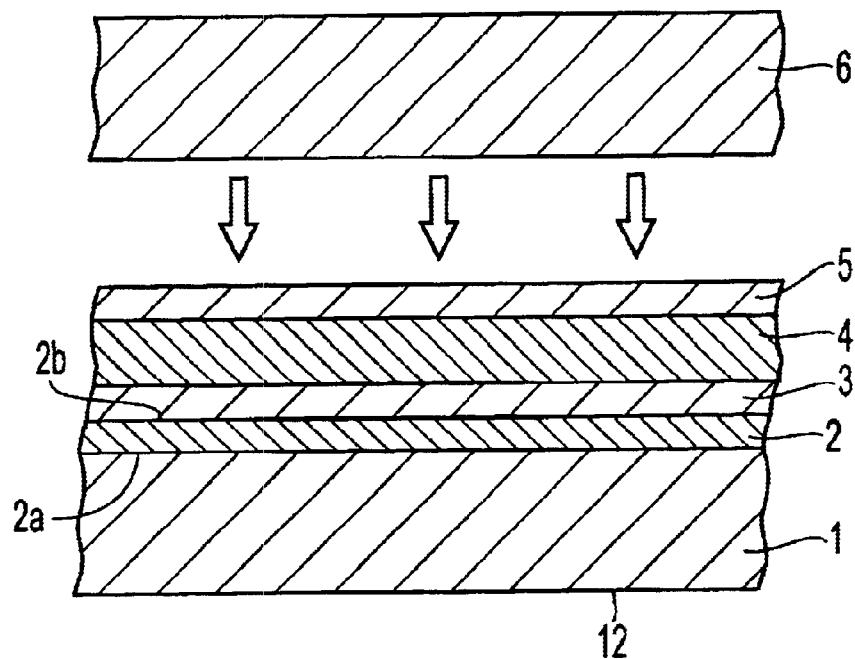
FIG. 4 is a schematic cross-sectional view of a step in an embodiment of a transfer process of a thin film structure in accordance with the present invention.

<4>As shown in FIG. 4, an adhesive layer 5 is formed on the transferred layer (cleaved member) 4 to bond the transferred layer 4 to the member 6, onto which the transferred layer is to be transferred, with the adhesive layer 5 provided therebetween.

Preferable examples of the adhesives for constituting the adhesive layer 5 include curable adhesives, for example, reactive curing adhesives, thermosetting adhesives, photosetting adhesives, such as UV curable adhesives, and anaerobic curing adhesives. The types of the adhesive include epoxys, acrylates, and silicones. The adhesive layer 5 may be formed by, for example, a coating process.

When the above curing adhesive is used, the curing adhesive is coated on the transferred layer 4, and the member 6 is bonded thereon, and then the curable adhesive is cured by a curing method depending on the property of the curable adhesive to bond the transferred layer 4 to the member 6.

When a photosetting adhesive is used, it is preferable that a translucent member 6 be provided on the uncured adhesive layer 5 and that the member 6 be then irradiated with light to cure the adhesive. A translucent substrate 1 is preferably used to secure curing since the adhesive can be cured by light incident on the substrate 1 and the member 6.

The adhesive layer 5 may be formed on the member 6 and then the transferred layer 4 may be bonded thereto, instead of the order shown in the drawing. The abovementioned intermediate layer may be provided between the transferred layer 4 and the adhesive layer 5. When the member 6 itself has an adhesive function, the formation of the adhesive layer 5 may be omitted.

A nonlimiting example of the member 6 is a substrate (plate), and particularly a transparent substrate. Such a substrate may be flat or curved.

The member 6 onto which the transferred layer is transferred may be inferior to the substrate 1 in characteristics, such as heat resistance and corrosion resistance. Since the transferred layer 4 is formed on the substrate 1 and is then transferred onto the member 6, the properties required for the member 6, including heat resistance, do not depend on the temperature when the transferred layer 4 is transferred.

When the maximum temperature when the transferred layer 4 is formed is $T_{max}$, materials having a glass transition point ($T_g$) or a softening point which is lower than $T_{max}$ can be used for the member 6. For example, the member 6 may be composed of a material having a glass transition point ($T_g$) or softening point of preferably 800° C. or less, more preferably 500° C. or less, and more preferably 320° C. or less.

In mechanical characteristics, the member 6 preferably has a certain level of rigidity (strength), but may have flexibility or elasticity.

Materials for the member 6 include various synthetic resins and glasses, and various synthetic resins and inexpensive conventional glass materials having a low melting point are preferable.

The synthetic resins may be thermoplastic resins or thermosetting resins. Examples of the synthetic resins include polyolefins, such as polyethylene, polypropylene, ethylenepropylene copolymers, and ethylene-vinyl acetate copolymers (EVA); cyclic polyolefins; modified polyolefins; polyvinyl chloride; polyvinylidene chloride; polystyrene; polyamides; polyimides; polyamide-imide resins; polycarbonates; poly-(4-methylpentene-1); ionomers; acrylic resins: polymethyl methacrylate (PMMA); acrylonitrile-butadienestyrene copolymers (ABS resins); acrylonitrile-styrene copolymers (AS resins); butadienestyrene copolymers; polyoxymethylene; polyvinyl alcohol (PVA); ethylene-vinyl alcohol copolymers (EVOH); polyesters, such as polyethylene terephthalate (PET), polybutylene terephthalate (PBT) and polycyclohexane terephthalate (PCT); polyethers; polyether ketones (PEK); polyether ether ketones (PEEK); polyether imides; polyacetals (POM); polyphenylene oxide; modified polyphenylene oxide; polysulfone; polyphenylene sulfide (PPS); polyether sulfone (PES); polyarylate; aromatic polyesters (liquid crystal polymers);

polytetrafluoroethylene; polyvinylidene fluoride; miscellaneous fluorinated resins; thermoplastic elastomers, including styrenic elastomers, polyolefin, polyvinyl chloride, polyurethanes, polyesters, polyamides, polybutadiene, transpolyisoprene, fluorinated rubbers, and chlorinated polyethylene; epoxy resins; phenol resins; urea resins; melamine resins; unsaturated polyesters; silicone resins; polyurethanes; and copolymers, blends and polymer alloys thereof. These resins may be used alone or in combination, for example, as a composite including two or more layers.

Examples of glass materials include silicate glass (quartz glass), alkaline silicate glass, soda-lime glass, potassium-lime glass, lead (alkaline) glass, barium glass, and borosilicate glass. These glasses other than silicate glass have low melting points compared to the silicate glass, are readily formable and workable, are inexpensive, and are preferable.

When the member 6 is composed of a synthetic resin, a large member 6 is integrally formed and a complicated shape such as a curved or irregular face can be readily formed. Additional advantages are low costs of materials and production. Thus, a large inexpensive device, for example, a liquid crystal display, can be readily produced.

The member 6 may be an independent device such as a liquid crystal cell or may be a part of a device, for example, a color filter, an electrode layer, a dielectric layer, an insulating layer, or a semiconductor device.

The member 6 may be metal, ceramic, stone, wood or paper. Alternatively, the member 6 may be an appropriate face of an article (a board of a clock, a surface of an air conditioner, or a surface of a print circuit board), or a surface of a structural unit, such as a wall, a column, a ceiling, or a window glass.

Figure 5:
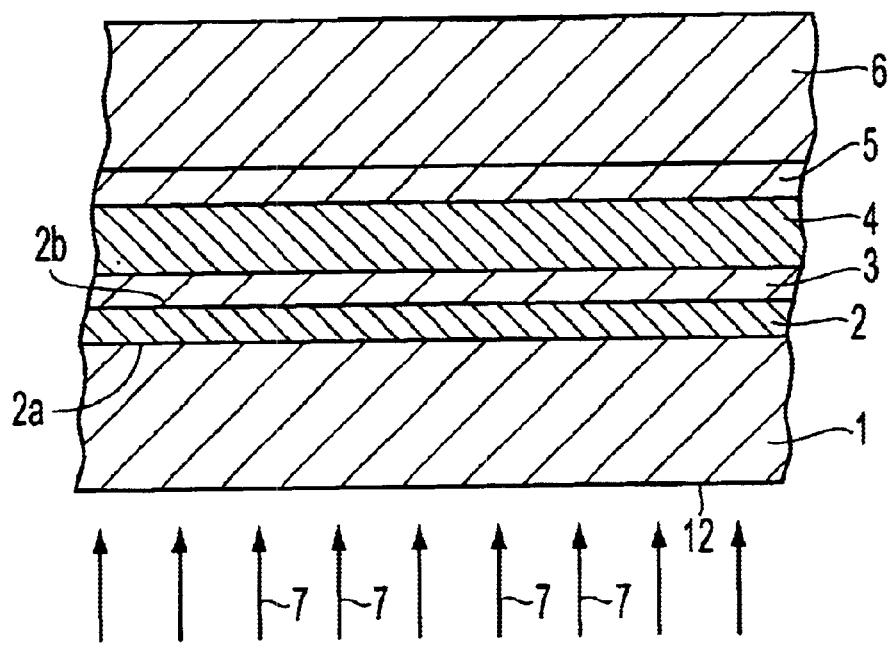
FIG. 5 is a schematic cross-sectional view of a step in an embodiment of a transfer process of a thin film structure in accordance with the present invention.
Figure 6:
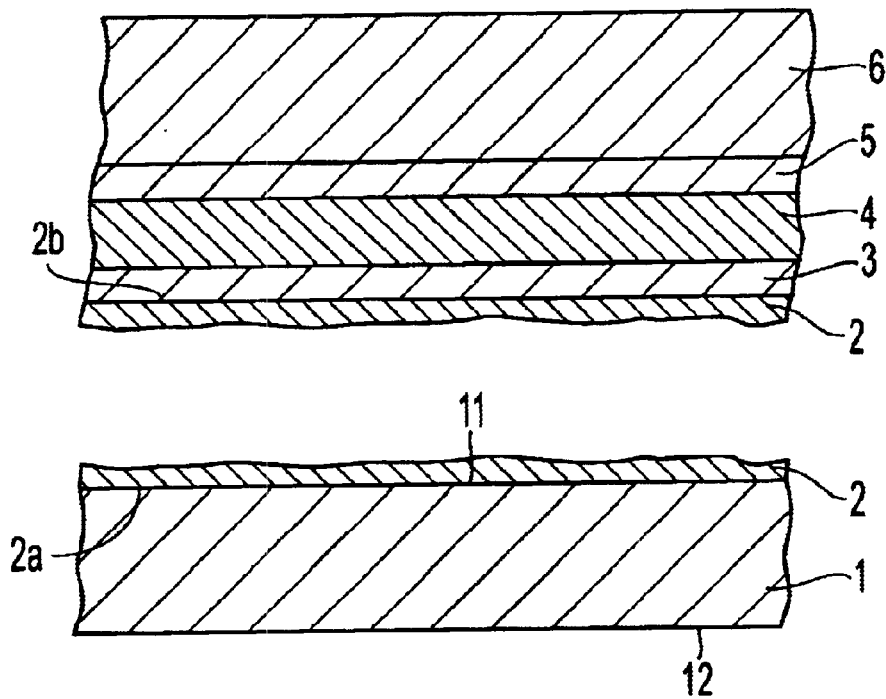
FIG. 6 is a schematic cross-sectional view of a step in an embodiment of a transfer process of a thin film structure in accordance with the present invention.
Figure 7:
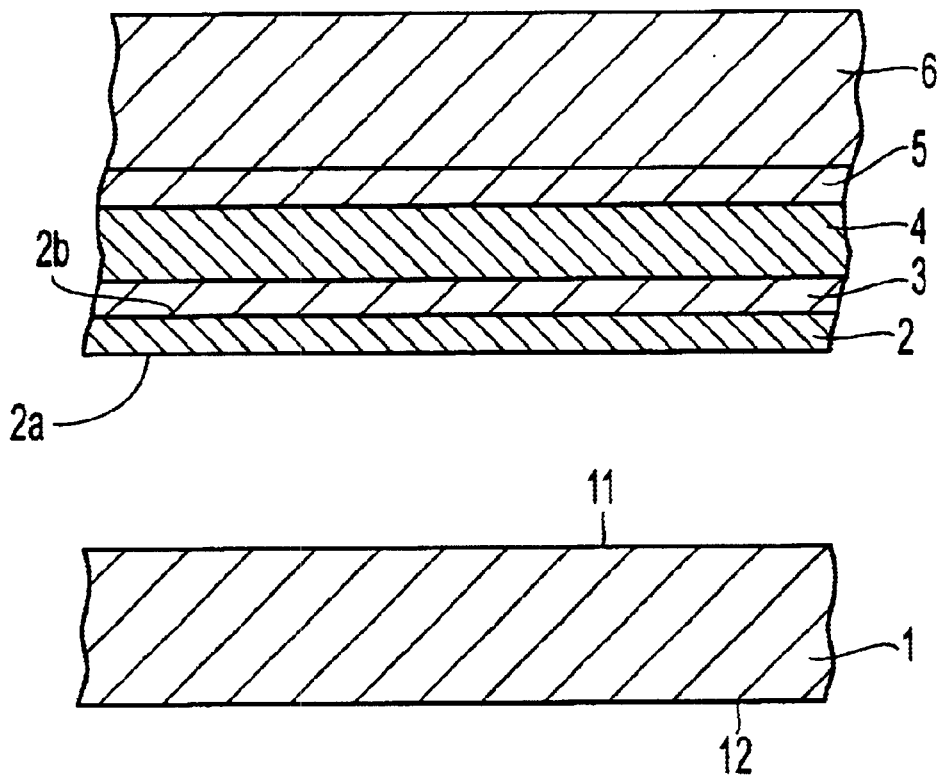
FIG. 7 is a schematic cross-sectional view of a step in an embodiment of a transfer process of a thin film structure in accordance with the present invention.

<5>As shown in FIG. 5, the back side of the substrate 1 (light incident side 12) is irradiated with the illuminating light 7. The illuminating light 7 passes through the substrate 1, and is incident on the cleaving layer 2 via the interface 2a. As shown in FIG. 6 or 7, intralayer cleavage and/or interfacial cleavage thereby occur in the cleaving layer 2. When the substrate 1 is peeled from the member 6, the transferred layer 4 is detached from the substrate 1 and is transferred onto the member 6 due to decreased or lost bonding force.

FIG. 6 shows intralayer cleavage in the cleaving layer 2, whereas FIG. 7 shows interfacial cleavage at the interface 2a of the cleaving layer 2. The occurrence of the intralayer cleavage and/or interfacial cleavage is presumably due to ablation in the material constituting the cleaving layer 2, gas evolution included in the cleaving layer 2, and phase change by the irradiation such as melting or vaporization.

Herein "ablation" means that a solid material which absorbs the illuminating light is photochemically or thermally excited and atomic or molecular bonds on the surface and in the interior are broken, and is observed as a phenomenon causing a phase change in which all or a part of the material in the cleaving layer 2 is melted or vaporized. Alternatively, the phase change may cause formation of fine pores which results in decreased bonding force.

Whether the cleaving layer 2 forms intralayer cleavage, interfacial cleavage, or simultaneous intralayer and interfacial cleavages depends on the composition of the cleaving layer 2 and various factors. Some of the factors are the type, wavelength, intensity, and penetration depth of the illuminating light 7.

Any illuminating light 7 may be used as long as it causes intralayer cleavage and/or interfacial cleavage in the cleaving layer 2. Examples of the illuminating light 7 include x-rays, ultraviolet rays, visible rays, infrared rays (heat rays), laser beams, millimeter waves, microwaves, electron beams, and radiations ($\alpha$-rays, $\beta$-rays, and $\gamma$-rays). Among these, laser beams are preferable since they readily cause cleavage (ablation) in the cleaving layer 2.

Examples of laser units for forming laser beams include gas lasers and solid lasers (semiconductor lasers). Excimer laser, Nd-YAG laser, Ar laser, $CO_2$ laser, CO laser and He-Ne laser are preferable. Among these, the excimer laser is more preferable.

Since the excimer laser outputs high energy in a short wave region, it can cause ablation in the cleaving layer 2 within a very short period. Thus, the cleaving layer 2 can be cleaved without substantial temperature rise, and thus without deterioration and damage in the intermediate layer 3, the transferred layer 4, and the substrate 1 in the proximity or vicinity thereof.

When the ablation in the cleaving layer 2 depends on the wavelength of the illuminating light 7, the wavelength of the illuminating light 7 is preferably in a range of approximately 100 to 350 nm.

When a phase change such as gas evolution, vaporization or sublimation imparts cleaving characteristics to the cleaving layer 2, the wavelength of the illuminating laser beam is preferably in a range of approximately 350 to 1,200 nm.

The energy density of the illuminating laser beam and particularly the excimer laser beam is in a range of preferably 10 to 5,000 $mJ/cm^2$, and more preferably 100 to 500 $mJ/cm^2$. The irradiation time is in a range of preferably 1 to 1,000 nsec, and more preferably 10 to 100 nsec. When the energy density is low or the irradiation time is short, sufficient ablation does not occur. When the energy density is high or the irradiation time is long, the light passing through the cleaving layer 2 and the intermediate layer 3 may adversely affect the transferred layer 4.

The illuminating light 7 such as a laser light beam is preferably radiated so that the intensity is uniform.

The illuminating light 7 may be incident on the cleaving layer 2 not only perpendicular to but also in a slant with a given angle to the cleaving layer 2.

When the area of the cleaving layer 2 is larger than the area of one spot of the illuminating light, the entire region of the cleaving layer 2 can be irradiated with a plurality of spots of the illuminating light. The same position may be irradiated with two or more spots.

The same region or different regions may be irradiated with two or more spots of different types and different wavelengths (wavelength regions) of illuminating light (laser beams).

Figure 8:
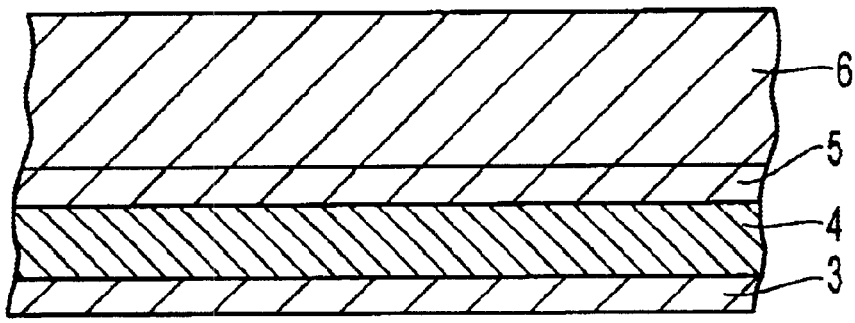
FIG. 8 is a schematic cross-sectional view of a step in an embodiment of a transfer process of a thin film structure in accordance with the present invention.

<6>As shown in FIG. 8, the cleaving layer 2 adhered to the intermediate layer 3 is removed by a cleaning, etching, ashing, or polishing method, or by a combination thereof In the intralayer cleavage of the cleaving layer 2 as shown in FIG. 6, the cleaving layer 2 adhered to the substrate 1 is also removed.

When the substrate 1 is composed of an expensive or rare material, such as quartz glass, the substrate 1 is preferably reused or recycled. In other words, the present invention is applicable to the substrate 1 for which reuse is preferable, and thus is very useful.

The transfer of the transferred layer 4 onto the member 6 is completed by the above steps. In the subsequent steps, the intermediate layer 3 adjoining the transferred layer 4 may be removed or any other layer may be formed thereon.

In the present invention, the transferred layer 4 as the cleaved member is not directly cleaved but the cleaving layer 2 bonded to the transferred layer 4 is cleaved. Thus, the cleaving layer 2 can be readily, securely, and uniformly cleaved or transferred regardless of the properties of the cleaved member (transferred layer 4) and the conditions.

Since the cleaved member (transferred layer 4) is not damaged during the cleaving operation, the transferred layer 4 can maintain high reliability.

In the embodiment shown in the drawings, the illuminating light 7 is incident on the substrate 1. When the illuminating light 7 does not affect the transferred layer 4, the side away from the substrate 1 may be irradiated with the illuminating light 7, without limiting the direction of the illuminating light 7.

The cleaving layer 2 may be partly irradiated with the illuminating light along the plane thereof, that is, with light having a given pattern so that the transferred layer 4 having the pattern is transferred (first method). In this case, the light incident side 12 of the substrate 1 is subjected to masking corresponding to the pattern before irradiatior of the illuminating light 7 in the step <5>, or the positions irradiated with the illuminating light 7 are precisely controlled.

Alternatively, a cleaving layer 2 having a predetermined pattern can be formed (second method) instead of the formation of the cleaving layer 2 on the entire cleaving layer forming face 11. In this case, a cleaving layer 2 having the predetermined pattern is previously formed by masking or the like, or the cleaving layer 2 formed on the entire cleaving layer forming face 11 is patterned or trimmed by etching or the like.

According to the first and second methods, the transfer of the transferred layer 4 can be simultaneously achieved together with the patterning and trimming.

Transfer operations may be repeated two or more times by the above procedure. When the transfer operations are repeated an even number of times, the front-back relationship of the transferred layer formed on the last member onto which the transferred layer is transferred is the same as that of the transferred layer originally formed on the substrate 1.

Transferred layers 4 (thin film transistors) having a small unit formed on a small substrate 1 having, for example, an effective area of 45 mm×40 mm can be sequentially transferred onto the adjacent positions of a large transparent substrate having, for example, an effective area of 900 mm×1,600 mm a plurality of times (for example, approximately 800 times) to form the transferred layer 4 onto the entire effective area of the large transparent substrate). A liquid crystal display having the same size as that of the large transparent substrate can be thereby produced.

A plurality of transferred layers 4 formed on the substrates 1 may be sequentially transferred (overlapped) onto the member 6 to form a composite of the transferred layers 4. In this case, the transferred layers 4 to be overlapped may be the same or different.

The method for transferring the thin film configuration used in the present invention has been described above.

A first embodiment of a method for making a three-dimensional device (multilayered device) using the above-mentioned method for transferring a thin film configuration will now be described.

Figure 9:
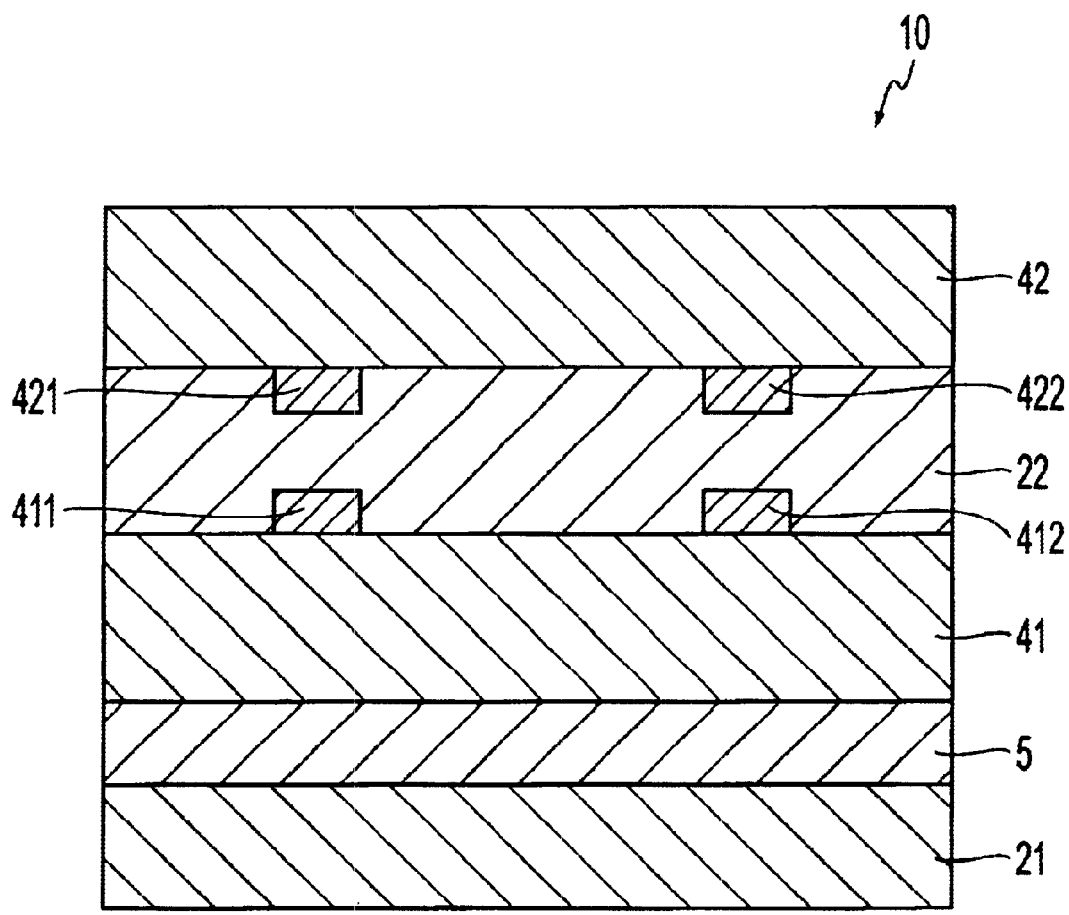
FIG. 9 is a schematic cross-sectional view of a configuration of a three-dimensional device in accordance with the present invention.

FIG. 9 is a schematic cross-sectional view of a configuration of a three-dimensional device, and FIGS. 10 to 15 are schematic cross-sectional views of the steps in the first embodiment of a method for making a three-dimensional device in accordance with the present invention. The common points with the above-described transfer process of the thin film configuration will not be described.

As shown in FIG. 9, a three-dimensional device 10 has a substrate (transferring-side substrate) 21 as a base, a first transferred layer (first thin film device layer) 41, and a second transferred layer (second thin film device layer) 42. The transferred layers 41 and 42 extend two-dimensionally (parallel to the substrate 21) to form a predetermined circuit.

In this case, the transferred layer 41 is bonded on the upper side of the substrate 21 in FIG. 9 with an adhesive layer 5.

Also, the transferred layer 42 is bonded on the upper side of the transferred layer 41 in FIG. 9 with a conductive adhesive layer 22.

The transferred layer 41 has connecting electrodes (connecting terminals) 411 and 412 thereon in FIG. 9. The transferred layer 41 has connecting electrodes (connecting terminals) 421 and 422 thereunder in FIG. 9. The connecting electrode 411 of the transferred layer 41 and the connecting electrode 421 of the transferred layer 42 are electrically connected to each other via the conductive adhesive layer 22, whereas the connecting electrode 412 of the transferred layer 41 and the connecting electrode 422 of the transferred layer 42 are electrically connected to each other via the conductive adhesive layer 22.

A preferable conductive adhesive layer 22 is an anisotropic conductive film (ACF). Since bonding with the anisotropic conductive film enables conduction only in the thickness direction (the longitudinal direction in FIG. 9), short-circuiting in the transverse direction in FIG. 9 is prevented. That is, short-circuiting between the connecting electrodes 411 and 412, between the connecting electrodes 411 and 422, between the connecting electrodes 421 and 422, and between the connecting electrodes 421 and 412 is prevented.

In the bonding with the anisotropic conductive film, the transferred layer 41 and the transferred layer 42 are bonded to each other while the connecting electrodes 411 and 421 and the connecting electrodes 412 and 422 are aligned so as to be electrically connected.

The substrate (transferring-side substrate) 21 of the three-dimensional device 10 corresponds to the member 6 onto which the transferred layer is transferred in FIGS. 4 to 8.

Examples of the transferred layers 41 and 42 of the three-dimensional device 10 include various types such as the above-described transferred layers 4.

That is, the transferred layers 41 and 42 may be dynamic RAMs (DRAMs), static RAMs (SRAMs), memories such as E²PROMs and ROMs, logics (logic circuits) such as CPU, and sensors such as an optical sensor or a magnetic sensor. Of course, the transferred layers 41 and 42 are not limited to the above examples.

The transferred layers 41 and 42 may be the same or different.

When the transferred layers 41 and 42 are the same, the transferred layer 41 and the transferred layer 42 may be, for example, memories (memory cell arrays). A large-capacity memory (integrated memory) is thereby achieved.

Alternatively, the transferred layer 41 and the transferred layer 42 may be, for example, logics (logic circuits). A large-capacity logic (integrated logic) is thereby achieved.

In an example in which the transferred layer 41 and the transferred layer 42 are different, for example, one of the transferred layer 41 and the transferred layer 42 is a memory and the other is a logic. That is, the three-dimensional device 10 is a system IC (for example, a system LSI) including (or integrating) a memory and a logic.

In such a case, the transferred layer 41 and the transferred layer 42 can be formed using different design rules (minimum line widths) according to the present invention. The transferred layer 41 and the transferred layer 42 can also be formed using different design parameters. Alternatively, the transferred layer 41 and the transferred layer 42 can be formed by different production processes. In conventional methods, it is impossible or difficult to change such conditions between the layers to be deposited.

The minimum line width of the memory in the system IC is, for example, approximately 0.35 μm (μm rule), and the minimum line width of the logic is, for example, approximately 0.5 μm (μm rule) (the minimum line width of the memory is smaller than the minimum line width of the logic). In contrast, the minimum width of the memory may be larger than the minimum width of the logic.

The three-dimensional device 10 is produced by the above-mentioned transfer process of a thin film configuration, for example, as follows.

Figure 10B:
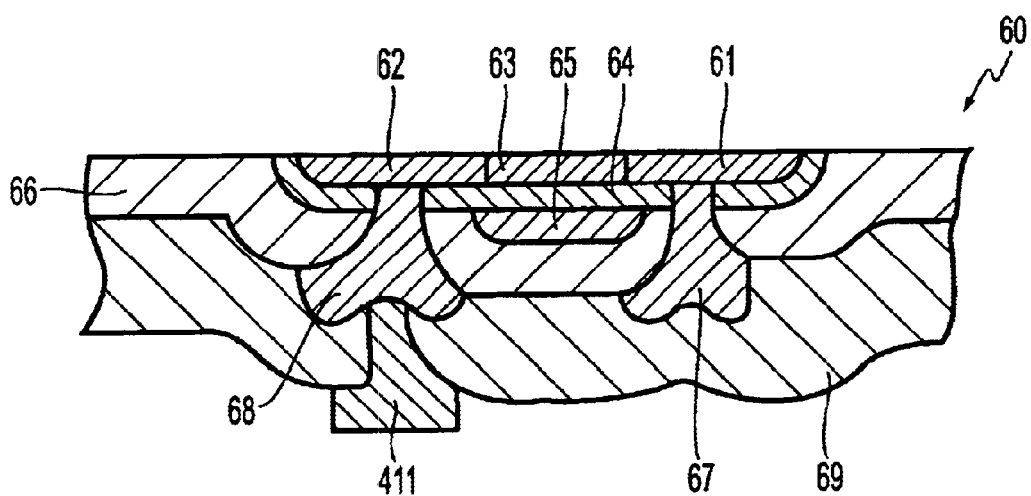
FIG. 10 is a schematic cross-sectional view of a step in a first embodiment of a method for making a three-dimensional device in accordance with the present invention.
Figure 10A:
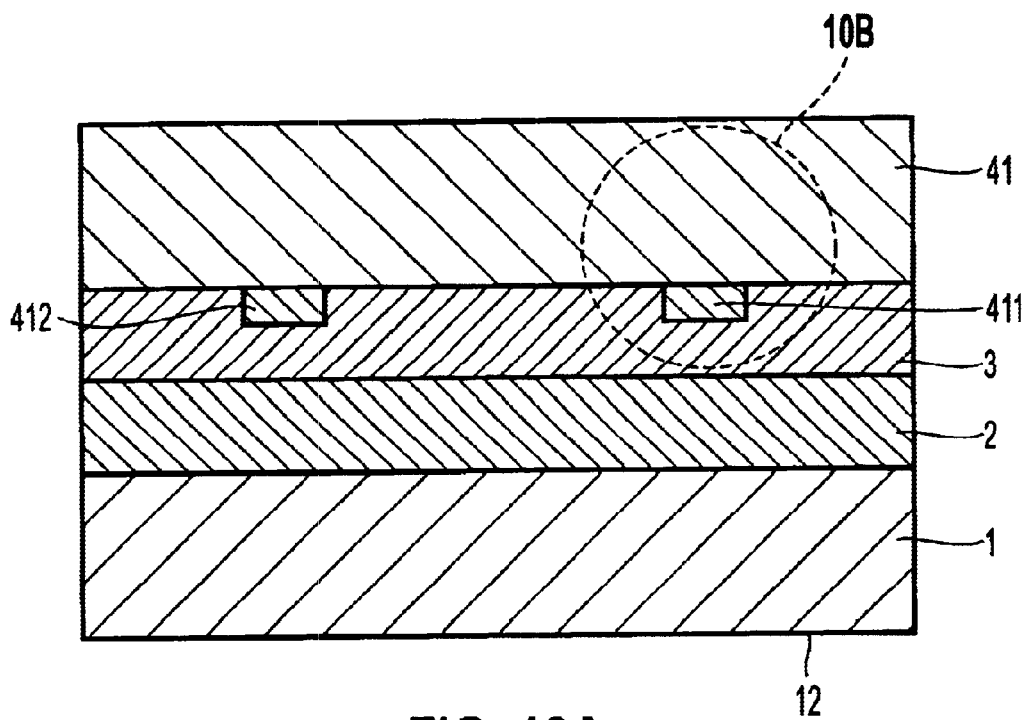
Figure 11B:
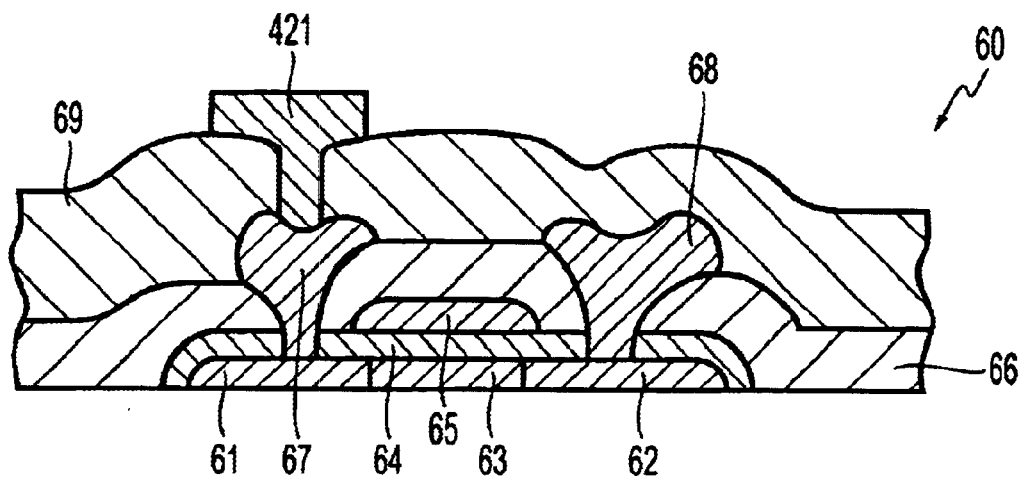
FIG. 11 is a schematic cross-sectional view of a step in a first embodiment of a method for making a three-dimensional device in accordance with the present invention.
Figure 11A:
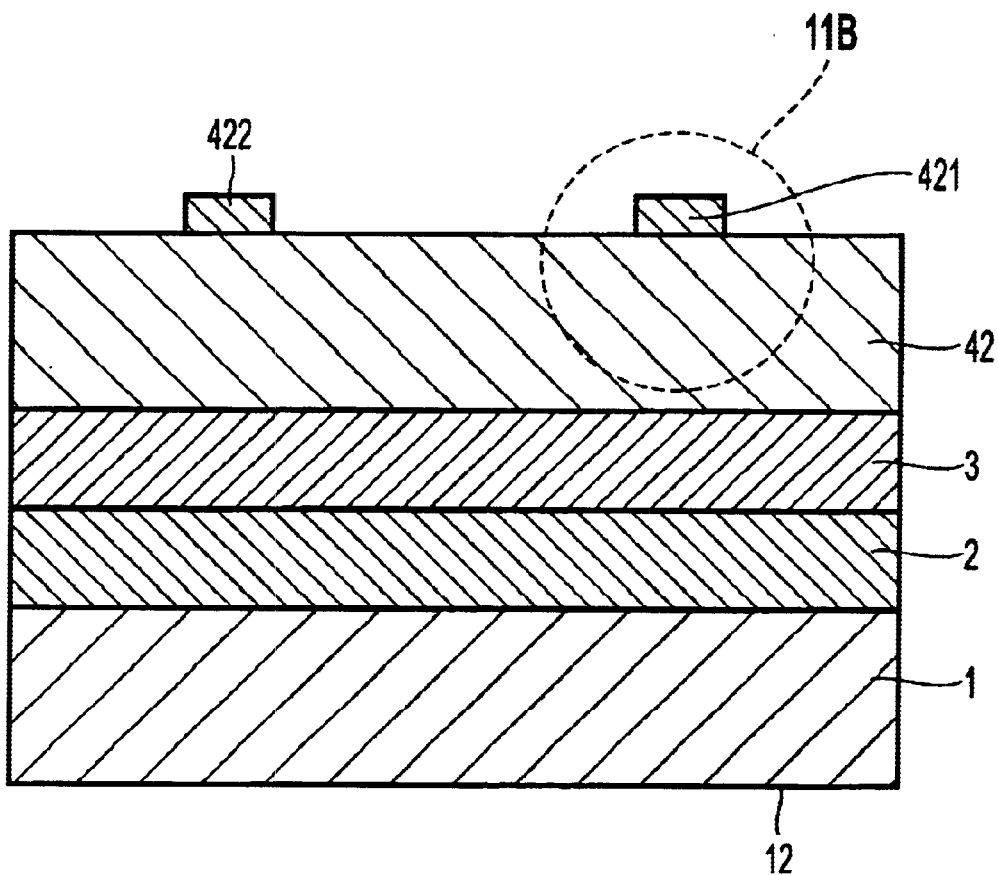

<A1>As shown in FIG. 10, a cleaving layer 2 is formed on one face of a substrate (original substrate) 1. As shown in FIG. 11, a cleaving layer 2 is formed on one face of a substrate (original substrate) 1.

<A2>As shown in FIGS. 10 and 11, an intermediate layer (underlying layer) 3 is formed on the cleaving layer 2 of each substrate 1.

<A3>As shown in FIG. 10, a first transferred layer (first thin film device layer) 41 is formed on the intermediate layer 3. As shown in FIG. 11, a second transferred layer (second thin film device layer) 42 is formed on the intermediate layer 3.

An enlarged cross-sectional view of the portion K (surrounded by a chain line in FIG. 10) of the transferred layer 41 is shown in FIG. 10.

As shown in FIG. 10, the transferred layer 41 has, for example, a thin film transistor (TFT) 60 formed on the intermediate layer 3 (for example an SiO₂ film).

The thin film transistor 60 includes a source layer (n⁺ or p⁺ layer) 61 and a drain layer (n⁺ or p⁺ layer) 62 which are formed by doping an n- or p-type impurity into a polysilicon layer, a channel layer 63, a gate insulating layer 64, a gate electrode 65, an insulating interlayer 66, electrodes 67 and 68 composed of, for example, aluminum, and a protective film 69.

A connecting electrode 411 is formed under the protective film 69 of the thin film transistor 60 in FIG. 10. The connecting electrode 411 is electrically connected to the electrode 68 via a contact hole formed in the protective film 69.

An enlarged cross-sectional view of the portion K (surrounded by a chain line in FIG. 11) of the transferred layer 42 is shown in FIG. 11.

As shown in FIG. 11, the transferred layer 42 has, for example, a thin film transistor (TFT) 60 formed on the intermediate layer 3 (for example a SiO₂ film).

The thin film transistor 60 includes a source layer (n⁺ or p⁺ layer) 61 and a drain layer (n⁺ or p⁺ layer) 62 which are formed by doping an n- or p-type impurity into a polysilicon layer, a channel layer 63, a gate insulating layer 64, a gate electrode 65, an insulating interlayer 66, electrodes 67 and 68 composed of, for example, aluminum, and a protective film 69.

A connecting electrode 421 is formed on the protective film 69 of the thin film transistor 60 in FIG. 11. The connecting electrode 421 is electrically connected to the electrode 67 via a contact hole formed in the protective film 69.

The configurations of the transferred layer 41 in the vicinity of the electrode 412 and the transferred layer 42 in the vicinity of the electrode 422 are substantially the same as the above-described configuration, and the description is omitted.

In the present invention, many transferred layers 41 may be simultaneously formed on one substrate, for example, a glass substrate, not shown in the drawing, and then may be cut off. Similarly, many transferred layers 42 may be simultaneously formed on one substrate, for example, a glass substrate, not shown in the drawing, and then may be cut off.

Each substrate provided with the transferred layer 41 or 42 is set into a probe apparatus, the connecting electrodes of each transferred layer 41 or 42 and terminals (not shown in the drawing) are connected to a probe to check electrical characteristics of each transferred layer 41 or 42. The transferred layers 41 and 42 which are judged as defective units are marked using an inker or a scratch needle.

The transferred layers 41 and 42 are separated by dicing. Individual transferred layers 41 and 42 are separated into defective units and nondefective units based on the marking. The test for electrical characteristics of the transferred layers 41 and 42 may be performed after dicing.

In the present invention, the transferred layer 41 and the transferred layer 42 may be simultaneously formed, particularly on the same substrate (original substrate) 1. The production steps can be thereby reduced.

Figure 12:
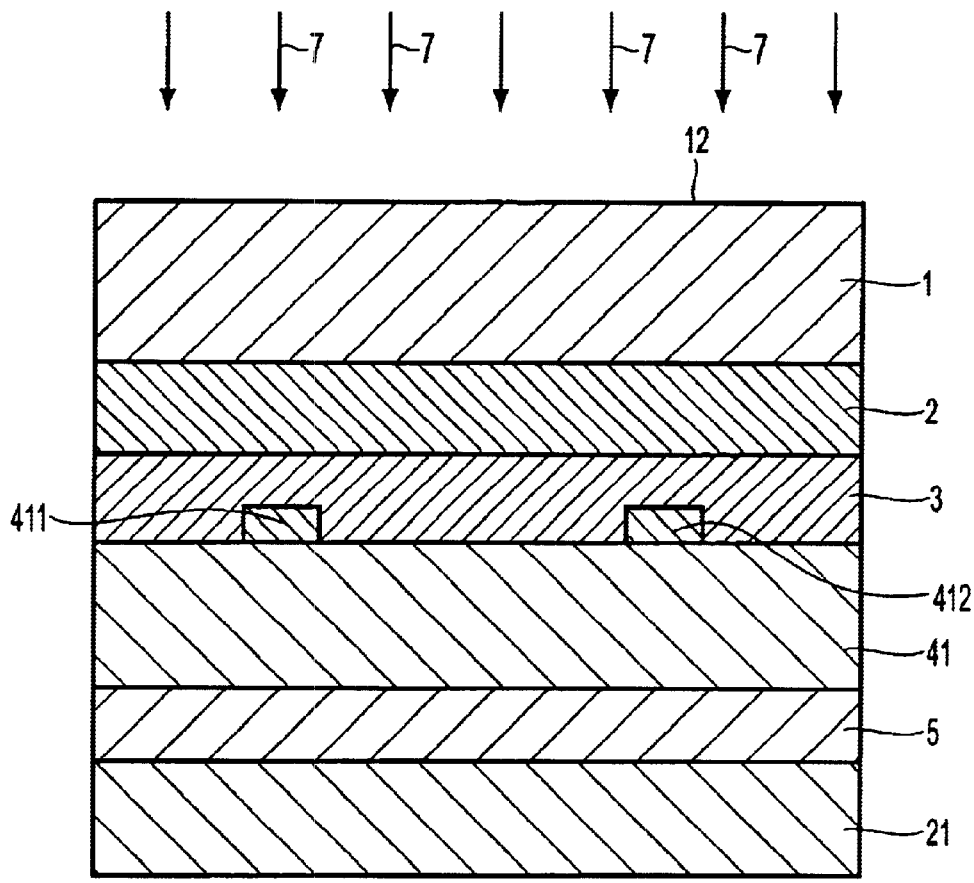
FIG. 12 is a schematic cross-sectional view of a step in a first embodiment of a method for making a three-dimensional device in accordance with the present invention.

<A4>As shown in FIG. 12, the transferred layer 41 formed on the substrate 1 is bonded to a substrate (transferred-side substrate) 21 with an adhesive layer 5.

<A5>As shown in FIG. 12, the back face (light incident face 12) of the substrate 1 is irradiated with illuminating light 7. The illuminating light 7 passes through the substrate 1, and is incident on the cleaving layer 2 to cause intralayer cleavage and/or interfacial cleavage in the cleaving layer 2, and thus to decrease or eliminate the bonding force.

Figure 13:
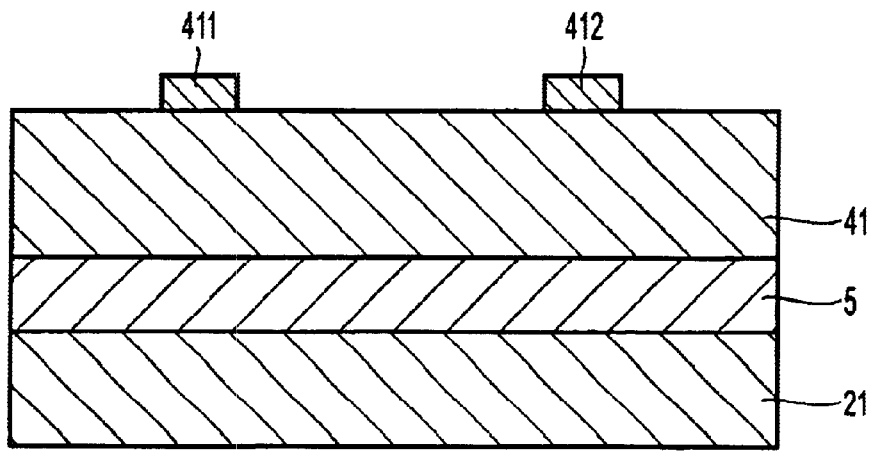
FIG. 13 is a schematic cross-sectional view of a step in a first embodiment of a method for making a three-dimensional device in accordance with the present invention.

The substrate 1 is detached from the substrate 21. As shown in FIG. 13, the transferred layer 41 is detached from the substrate 1 and is transferred onto the substrate 21.

<A6>As shown in FIG. 13, the intermediate layer 3 and the cleaving layer 2 on the transferred layer 41 is removed by a cleaning, etching, ashing, or polishing method, or by a combination thereof. The intermediate layer 3 may remain so as to expose the connecting electrodes 411 and 412, if necessary.

In the case of the intralayer cleavage in the cleaving layer 2, the cleaving layer 2 remaining on the substrate 1 is also removed.

When the substrate 1 is composed of an expensive or rare material, such as quartz glass, the substrate 1 is preferably reused or recycled. In other words, the present invention is applicable to the substrate 1 for which reuse is preferable, and thus is very useful.

The transfer of the transferred layer 41 onto the substrate 21 is completed by the above steps. In the subsequent step, any other layer may be formed thereon.

Figure 14:
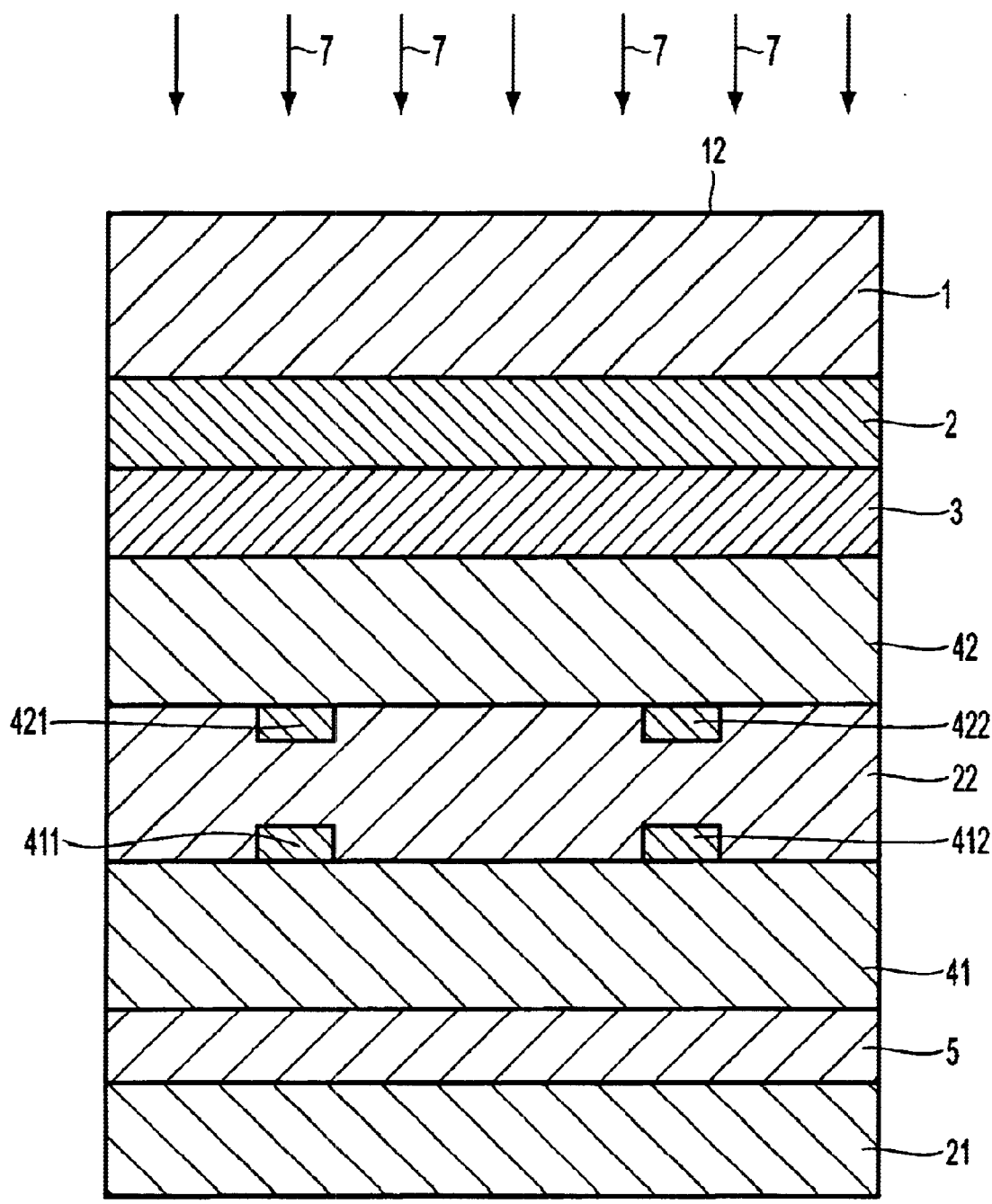
FIG. 14 is a schematic cross-sectional view of a step in a first embodiment of a method for making a three-dimensional device in accordance with the present invention.

<A7>As shown in FIG. 14, the corresponding connecting electrodes are positioned so that these electrodes are opposite each other, that is, the connecting electrode 411 is opposite the connecting electrode 421 and the connecting electrode 412 is opposite the connecting electrode 422, while the transferred layer 42 formed on the substrate 1 is bonded to the transferred layer 41 transferred onto the substrate 21 with a conductive adhesive layer 22.

Although the conductive adhesive layer 22 is preferably an anisotropic conductive film, it is not limited thereto in the present invention.

When bonding is performed using the anisotropic conductive film, the anisotropic conductive film is supplied between the transferred layer 41 and the transferred layer 42 and cured while pressing in the longitudinal direction in FIG. 14. Thus, the transferred layer 41 and the transferred layer 42 are bonded to each other with the conductive adhesive layer 22, and conductive particles (not shown in the drawing) in the conductive adhesive layer 22 are connected (are put into contact with each other) in the longitudinal direction in FIG. 14 so that the connecting electrodes 411 and 412 and the connecting electrodes 412 and 422 are electrically connected via the conductive particles.

<A8>As shown in FIG. 14, the back face (the light incident face 12) of the substrate 1 is irradiated with the illuminating light 7. As described above, the illuminating light 7 passes through the substrate 1, and is incident on the cleaving layer 2 to cause intralayer cleavage and/or interfacial cleavage in the cleaving layer 2 and thus to decrease or eliminate bonding force.

Figure 15A:
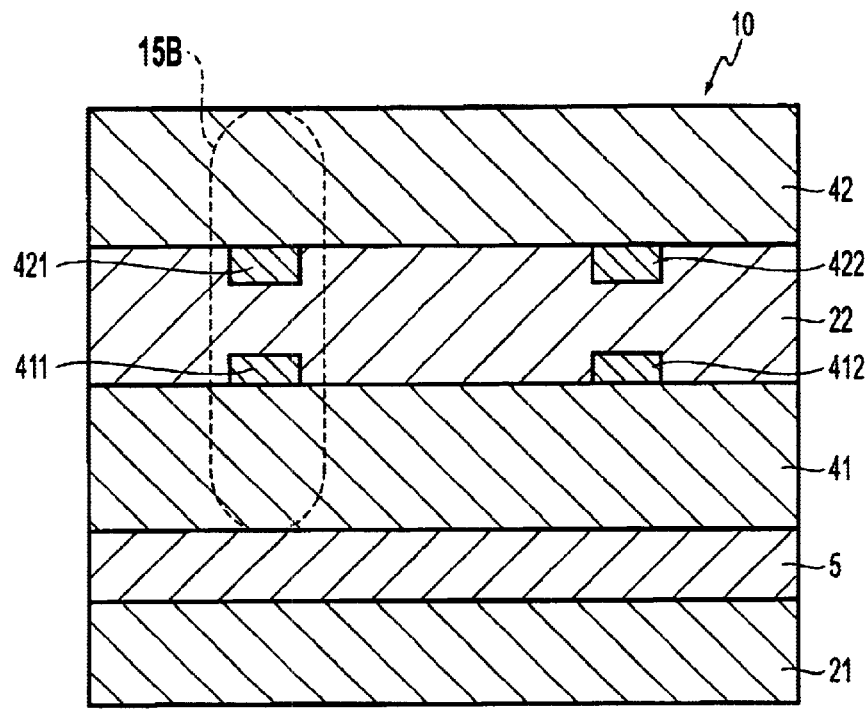
FIG. 15 is a schematic cross-sectional view of a step in a first embodiment of a method for making a three-dimensional device in accordance with the present invention.
Figure 15B:
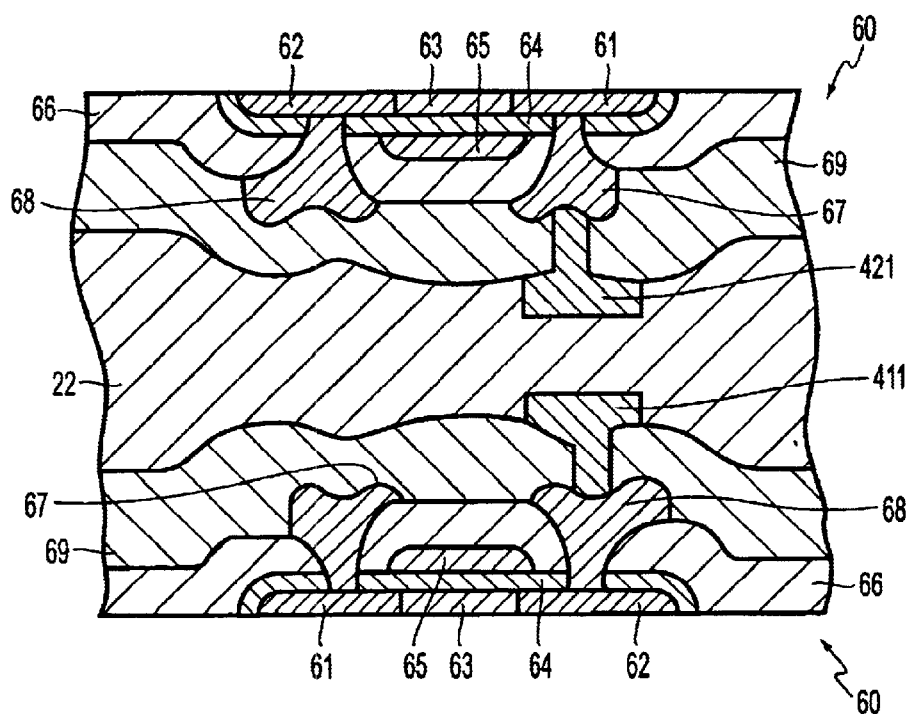

The substrate 1 is detached from the substrate 21. As shown in FIG. 15, the transferred layer 42 is detached from the substrate 1 and is transferred onto the transferred layer 41.

An enlarged cross-sectional view of the portion K (surrounded by a chain line in FIG. 15) including the transferred layers 41 and 42 and the conductive adhesive layer 22 is shown in FIG. 15.

<A9>As shown in FIG. 15, the intermediate layer 3 and the cleaving layer 2 on the transferred layer 42 is removed by a cleaning, etching, ashing, or polishing method, or by a combination thereof. The intermediate layer 3 may remain, if necessary.

In the case of the intralayer cleavage in the cleaving layer 2, the cleaving layer 2 remaining on the substrate 1 is also removed.

When the substrate 1 is composed of an expensive or rare material, such as quartz glass, the substrate 1 is preferably reused or recycled. In other words, the present invention is applicable to the substrate 1 for which reuse is preferable, and thus is very useful.

The transfer of the transferred layer 42 onto the transferred layer 41, that is, deposition of the transferred layer 42 onto the transferred layer 41 is completed by the above steps. In the subsequent step, any other layer may be formed thereon.

As described above, a three-dimensional device, for example, a three-dimensional IC 10 can be readily produced by transfer according to the present invention.

Since individual thin film device layers can be independently produced, wide ranges of production conditions can be selected without considering adverse effects on the underlying layers (underlying thin film device layers), unlike conventional processes.

Since a plurality of thin film device layers is deposited in the present invention, integration density is increased. Thus, ICs can be formed in a relatively small area even by a relatively moderated design rule.

For example, when the three-dimensional device 10 has memories (when both the transferred layers 41 and 42 are memories), the memories have a large capacity. When the three-dimensional device 10 has logics (when both the transferred layers 41 and 42 are logics), the logics have a large scale. Since individual thin film device layers can be formed on different substrates in the present invention, each thin film device layer can be formed by appropriate device parameters, for example, a gate line width, a thickness of the gate insulating film, a design rule, and production conditions such as temperature. Since each thin film device layer can be formed by optimized device parameters, the resulting three-dimensional device 10 has high reliability and high performance.

For example, when the three-dimensional device 10 is a system IC (for example, a system LSI) including (or integrating) a memory and a logic, the memory and the logic can be formed by desirable processes in the production of the system IC, resulting in readily production, high productivity, and advantageous mass production.

Since a connecting electrode (connecting terminal) is formed at one end of each thin film device layer, adjacent thin film device layers can be readily, securely, and electrically connected. Thus, the three-dimensional device 10 has a three-dimensional configuration (has a three-dimensional circuit).

Since only nondefective units are selected in deposition of each thin film device layer, the product yield is improved compared to production of three-dimensional devices by deposition of each layer on the same substrate (direct formation of each layer).

Transfer can be performed onto various substrates 21 (transferred-side substrates) without limitation. That is, a thin film device layer can be formed by transfer onto a substrate composed of a material which is not capable of or suitable for direct formation of the thin film device layer, which can be readily shaped, or which is inexpensive. In other words, the substrate 21 is appropriately selected. Since ICs can be formed on a flexible substrate, and IC cards and the like can be readily produced.

Since a relatively inexpensive glass substrate having a large area can be used as the substrate (original substrate) 1, cost is reduced.

In the above-described embodiment, the transfer of the transferred layers (thin film device layers) 41 and 42 is performed once. In the present invention, the transfer of the transferred layer 41 may be performed two or more times and the transfer of the transferred layer 42 may be performed two or more times, as long as the transferred layer 41 and the transferred layer 42 can be deposited.

For example, when the transferred layer is transferred twice, the transferred layer on the substrate 1 is transferred onto a third substrate (not shown in the drawing), not onto the substrate 1 and the substrate 21, and then the transferred layer on the third substrate is transferred onto the substrate 21. The above-described cleaving layer 2 is previously formed on the third substrate.

When the transferred layer is transferred an even number of times, the front-back relationship of the transferred layer formed on the substrate (transferred-side substrate) 21 that is the last member onto which the transferred layer is transferred is the same as that of the transferred layer originally formed on the substrate (original substrate) 1.

In the present invention, a transferred layer 41 may be directly formed onto the substrate (transferring-side substrate) 21 and a transferred layer 42 may be transferred onto the transferred layer 41 by the above-described transfer process to produce a three-dimensional device 10.

Three or more transferred layers (thin film device layers) may be deposited in the present invention. An increase in the deposited transferred layers causes an increase in integration density.

Figure 16:
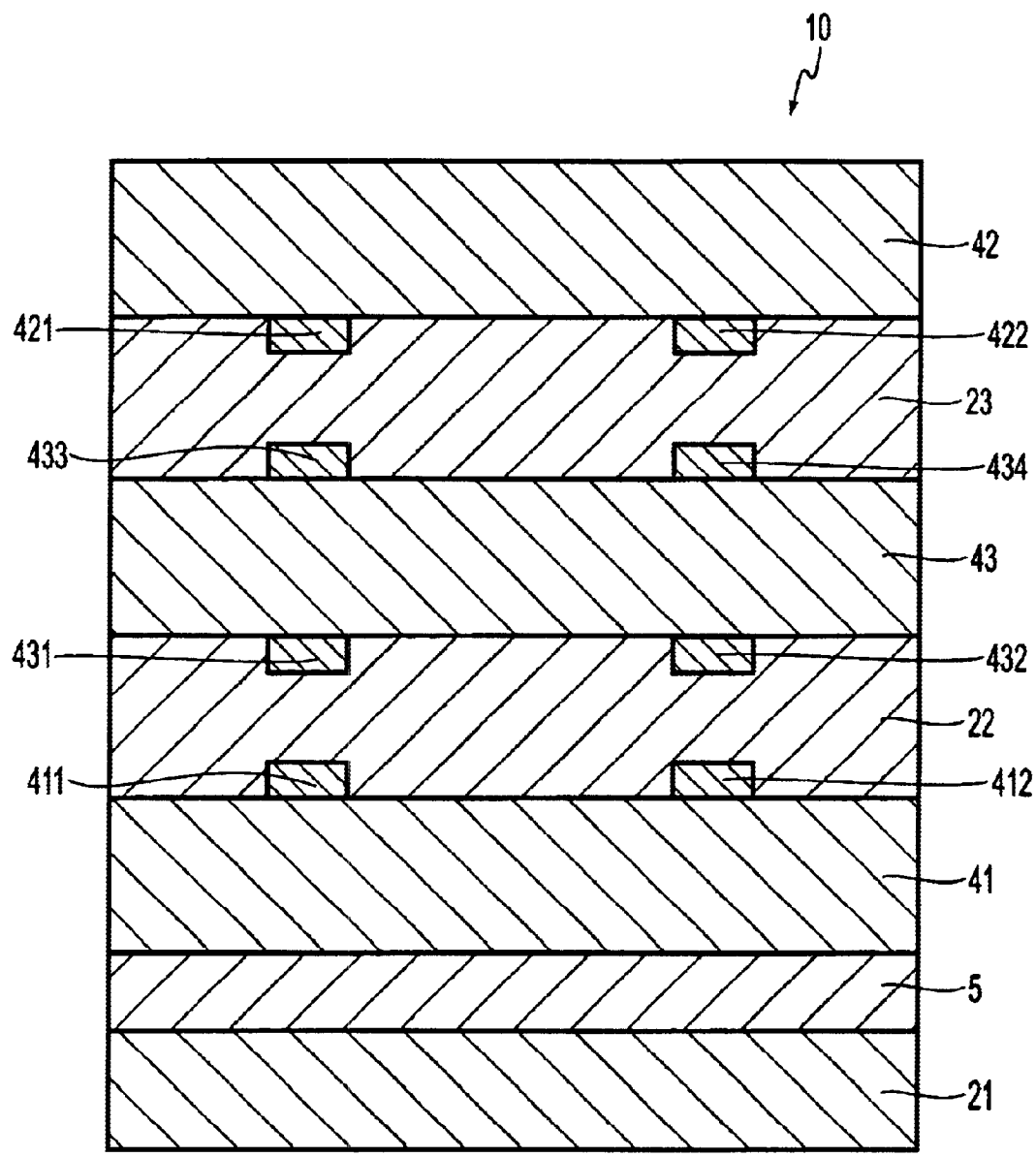
FIG. 16 is a schematic cross-sectional view of another configuration of a three-dimensional device in accordance with the present invention.

For example, when the three-dimensional device 10 has three transferred layers (thin film device layers) and when the adjacent transferred layers are electrically connected to each other, connecting electrodes (connecting terminals) are formed at both ends of a third transferred layer (third thin film device layer) 43 disposed between a first transferred layer (first thin film device layer) 41 and a second transferred layer (second thin film device layer) 42. That is, connecting electrodes 431 and 432 are formed at one end of the transferred layer 43 (the lower side in FIG. 16), whereas connecting electrodes 433 and 434 are formed at the other end (the upper side in FIG. 16).

The connecting electrode 411 of the transferred layer 41 and the connecting electrode 431 of the transferred layer 43 are electrically connected via a conductive adhesive layer 22, and the connecting electrode 412 of the transferred layer 41 and the connecting electrode 432 of the transferred layer 43 are electrically connected via the conductive adhesive layer 22. Similarly, the connecting electrode 433 of the transferred layer 43 and the connecting electrode 421 of the transferred layer 42 are electrically connected via a conductive adhesive layer 23, and the connecting electrode 434 of the transferred layer 43 and the connecting electrode 422 of the transferred layer 42 are electrically connected via the conductive adhesive layer 23.

A preferable conductive adhesive layer 23 is an anisotropic conductive film for the same reason as that for the conductive adhesive layer 22.

When the transferred layers (thin film device layers) are deposited three or more times, these layers may be completely the same or different, or may be partially the same.

A second embodiment of a method for making a three-dimensional device will now be described.

Figure 17:
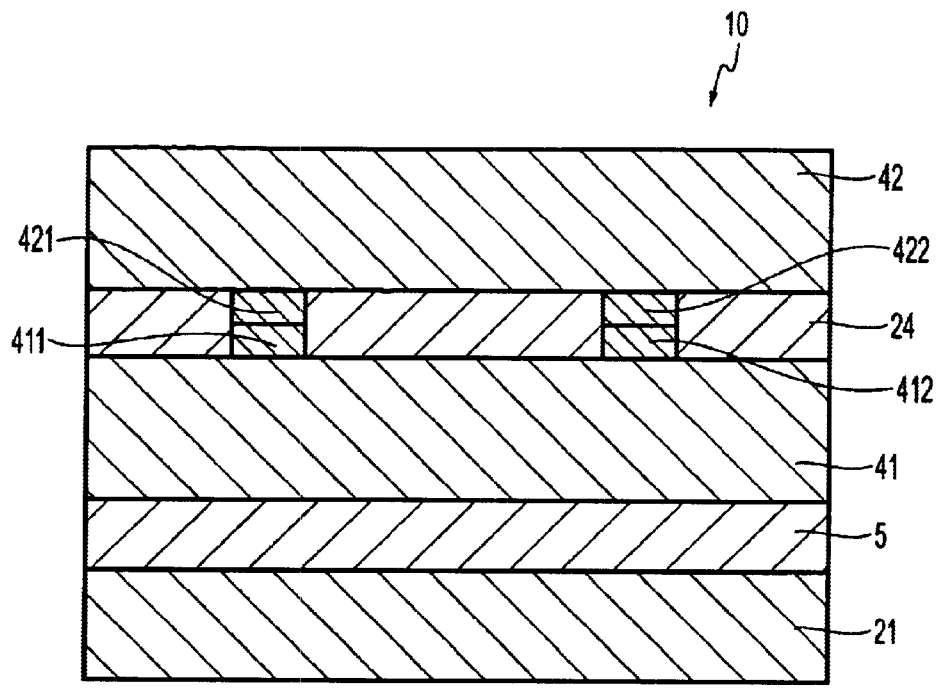
FIG. 17 is a schematic cross-sectional view of another configuration of a three-dimensional device in accordance with the present invention.

FIG. 17 is a schematic cross-sectional view of a configuration of a three-dimensional device. The common points with the above-described first embodiment are not described, and main differences will be described.

A three-dimensional device 10 shown in FIG. 17 is also produced by a transfer process of a thin film configuration as in the first embodiment.

In this three-dimensional device 10, in the above step <A7>, the connecting electrode 411 of the first transferred layer (first thin film device layer) 41 is put into contact with the connecting electrode 421 of the second transferred layer (second thin film device layer) 42 to electrically connect these layers, the connecting electrode 412 of the transferred layer 41 is put into contact with the connecting electrode 422 of the second transferred layer 42 to electrically connect these layers, and the transferred layer 41 and the transferred layer 42 are bonded to each other with an adhesive layer 24.

The second embodiment also has the same advantages as that of the first embodiment.

In the present invention, the method for bonding the transferred layer 41 to the transferred layer 42 and the method for electrically connecting the corresponding connecting electrodes are not limited to those described in the first embodiment and the second embodiment.

For example, when the connecting electrodes 411 and 412 are put into contact with the connecting electrodes 421 and 422, respectively, these are heated to melt the contact faces, and then the faces are solidified to bond the corresponding connecting electrodes. As a result, the corresponding connecting electrodes are electrically connected and the transferred layer 41 and the transferred layer 42 are bonded.

Alternatively, a solder (conductive brazing agent) may be disposed between the connecting electrode 411 and the connecting electrode 421 and between the connecting electrode 412 and the connecting electrode 422, may be heated to be melted, and may then be solidified. As a result, the corresponding connecting electrodes are electrically connected via the solder and the transferred layer 41 and the transferred layer 42 are bonded with the solder.

A third embodiment of a method for making a three-dimensional device will now be described.

Figure 18:
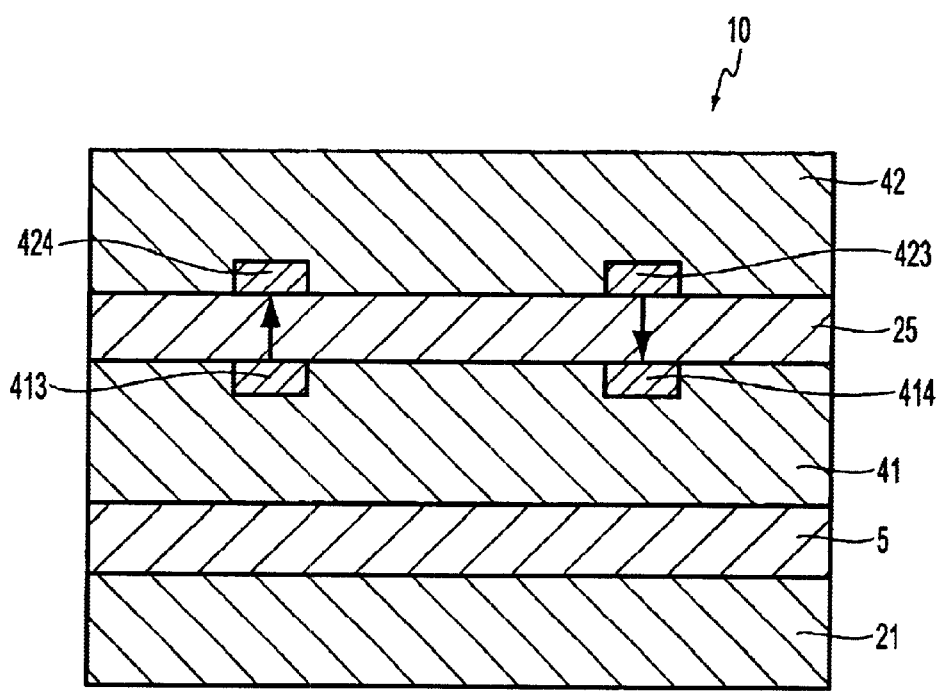
FIG. 18 is a schematic cross-sectional view of another configuration of a three-dimensional device in accordance with the present invention.

FIG. 18 is a schematic cross-sectional view of a configuration of a three-dimensional device. The common points with the above-described first embodiment are not described, and main differences will be described.

A three-dimensional device 10 shown in FIG. 18 is also produced by a transfer process of a thin film configuration as in the first embodiment.

A light emitting section (luminescent device) 413 and a light receiving section (light receiving device) 414 are formed on one face of a first transferred layer (first thin film device layer) 41 (the upper side in FIG. 18) of the three-dimensional device 10.

Also, a light emitting section (luminescent device) 423 and a light receiving section (light receiving device) 424 are formed on one face of a second transferred layer (second thin film device layer) 42 (the lower side in FIG. 18).

In this three-dimensional device 10, as in the above step <A7>, positioning is performed so that the light emitting sections are opposite the corresponding light receiving section, that is, the light emitting section 413 is opposite the light receiving section 424 and the light emitting section 423 is opposite the light receiving section 414, while the transferred layer 41 and the transferred layer 42 are bonded to each other with a substantially transparent adhesive layer 25 (having transmissivity to light from the light emitting sections 413 and 423).

For example, organic EL devices can be used as the light emitting sections 413 and 423 in the three-dimensional device 10.

Figure 19:
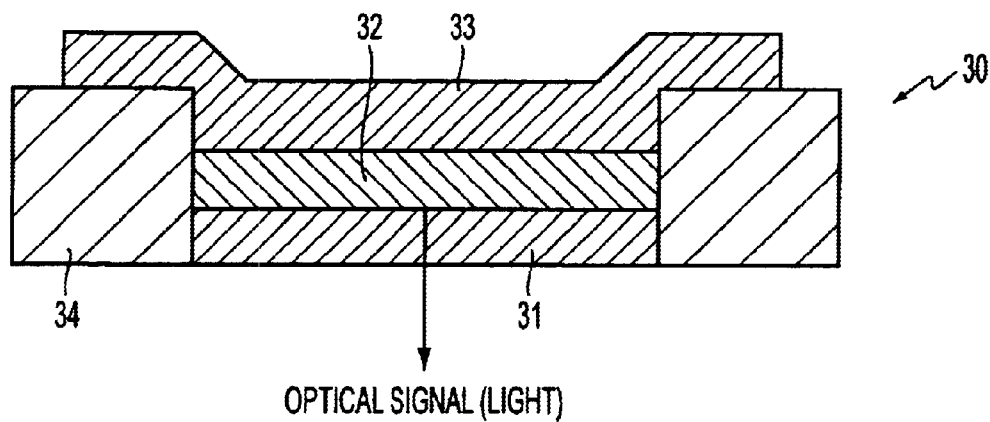
FIG. 19 is a cross-sectional view of a configuration of an organic electroluminescent (EL) device in accordance with the present invention.

FIG. 19 is a cross-sectional view of a configuration of an organic electroluminescent (EL) device.

As shown in the drawing, an organic EL device 30 has a barrier (bank) 34, a transparent electrode 31 and a light emitting layer (organic EL) 32 formed in the barrier 34, and a metallic electrode 33.

In this case, the light emitting layer 32 is formed on the transparent electrode 31, and the metallic electrode 33 is formed on the barrier 34 and the light emitting layer 32.

The transparent electrode 31 is composed of, for example, ITO.

The light emitting layer 32 is composed of a thin film (solid thin film) obtained by heating an organic EL device composition in which a precursor of a conjugated organic polymer for forming the light emitting layer 32 and a fluorescent pigment for modifying the luminescent characteristics of the light emitting layer 32 are dissolved or dispersed into a given solvent (polar solvent) so that the precursor in the organic EL device composition is polymerized.

The metallic electrode 33 is composed of, for example, Al—Li.

The barrier 34 is composed of, for example, a resin black resist.

Each of the transferred layers 41 and 42 has a driving section (driving circuit) (not shown in the drawing) for driving the organic EL device 30.

When a given voltage is applied between the transparent electrode 31 and the metallic electrode 33 from the driving circuit in the organic EL device 30, electrons and holes are injected into the light emitting layer 32, and moved in the light emitting layer 32 by means of an electric field formed by the applied voltage, and recombined. The energy evolved during the recombination forms excitons, and the excitons return to the ground state while evolving energy (fluorescent or phosphorescent light). Such a phenomenon is called electroluminescence (EL).

For example, PIN photodiodes may be used as the light receiving sections 414 and 424 in the three-dimensional device 10.

Figure 20:
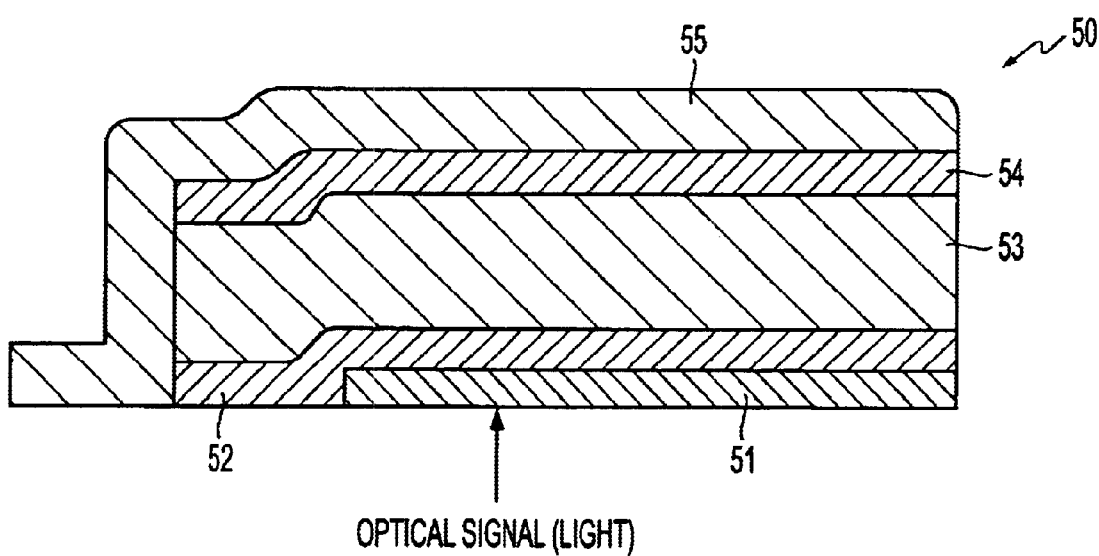
FIG. 20 is a cross-sectional view of a configuration of a PIN photodiode in accordance with the present invention.

FIG. 20 is a cross-sectional view of a configuration of a PIN photodiode.

As shown in the drawing, a PIN photodiode 50 includes a light-receiving section window electrode 51, a p-type a—SiC layer (p-type semiconductor layer) 52, an i-type a—Si layer (i-type semiconductor layer) 53, an n-type a—SiC layer (n-type semiconductor layer) 54, and an Al—Si—Cu layer 55 functioning as a light-receiving section upper electrode and a lead line (electrical line).

The light-receiving section window electrode 51, the p-type a-SiC layer 52, the i-type a—Si layer 53, the n-type a—SiC layer 54, and the Al—Si—Cu layer 55 are deposited in that order from the bottom side in FIG. 20. The light-receiving section window electrode 51 is composed of, for example, ITO.

As described above, the organic EL device 30 is driven by a driving circuit (not shown in the drawing) electrically connected to the organic EL device 30 to emit light. That is, the organic EL device 30 submits optical signals (light).

The light from the organic EL device 30 passes through the adhesive layer 25 and is incident on the light-receiving section window electrode 51. That is, the PIN photodiode 50 receives the light.

The PIN photodiode 50 outputs a current, i.e., an electrical signal in response to the intensity of the received light (the optical signal is output as an electrical signal).

A circuit (not shown in the drawing) electrically connected to the PIN photodiode 50 operates based on the signal from the PIN photodiode 50.

As shown in FIG. 18, the light from the light emitting section 413 passes through the adhesive layer 25 and is incident on the light receiving section 424, and the light from the light emitting section 423 passes through the adhesive layer 25 and is incident on the light receiving section 414. That is, the light emitting sections 413 and 423 and the light receiving sections 414 and 424 perform optical communication between the transferred layer 41 and the transferred layer 42.

The third embodiment also has the same advantages as that of the first embodiment.

In the configuration in the third embodiment, signal transmittance between layers is performed by optical signals, not by electrical signals. Thus, production is facilitated and integration density can be further increased.

In the present invention, the light emitting sections 413 and 423 may be composed of inorganic EL devices, light emitting diodes (LEDs), or semiconductor lasers (laser diodes), in addition to the organic EL devices.

In the present invention, the light receiving sections 414 and 424 may be composed of photodiodes, such as PN photodiodes and avalanche photodiodes, phototransistors, and photoluminescence devices (organic and inorganic photoluminescence devices), in addition to the PIN photodiodes.

The bonding method of the transferred layer (thin film device layer) 41 and the transferred layer (thin film device layer) 42 is not limited to the above-described method. That is, the transferred layer 41 and the transferred layer 42 are bonded to each other so that optical communication is achieved between the transferred layer 41 and the transferred layer 42.

For example, the transferred layer 41 and the transferred layer 42 can be partly bonded to each other. In such a case, when bonding is performed at the sections other than the light emitting sections 413 and 423 and the light receiving sections 414 and 424, the transferred layer 41 and the transferred layer 42 may be bonded to each other with an opaque adhesive layer.

The transferred layer 41 and the transferred layer 42 may be bonded to each other with a spacer (for example, a column) provided between the transferred layer 41 and the transferred layer 42. In such a case, gaps are formed between the light emitting section 413 and the light receiving section 414 of the transferred layer 41 and between the light emitting section 423 and the light receiving section 424 of the transferred layer 42.

The light emitting section 413 of the transferred layer 41 may be put into contact with the light receiving section 414, and the light emitting section 423 of the transferred layer 42 may be put into contact with the light receiving section 424.

When the number of the transferred layers (thin film device layers) in the three-dimensional device is three or more, this embodiment may include a configuration enabling optical communication between layers which are not adjacent to each other.

In the present invention, the light emitting section may consist of a plurality of luminescent devices having different luminescent characteristics (for example, peak wavelengths of the luminescent light) and the light receiving section may consist of a plurality of light receiving devices for receiving the light from the corresponding luminescent devices.

In such a case, a plurality of information signals can be simultaneously transmitted. That is, information transmission by multichannel optical communication is achieved.

In the present invention, a plurality of light emitting sections having different luminescent characteristics (for example, peak wavelengths of the luminescent light) may be provided, and a plurality of light receiving sections may be provided for receiving the light from the corresponding light emitting sections.

The present invention also include a configuration which can achieve optical communication in at least a given transferred layer (thin film device layer), as in that between the transferred layers (thin film device layers).

The method for making the three-dimensional device of the present invention has been described above with reference to the embodiments shown in the drawings, but the present invention is not limited thereto.

For example, when the number of the transferred layers (thin film device layers) is three or more in the present invention, given transferred layers may be electrically connected to each other as in the first and second embodiments, whereas the other transferred layers may be optically connected to each other as in the third embodiment, so as to enable optical communication.

In the present invention, partial regions of given transferred layers may be electrically connected to each other and the other regions may be optically connected to each other.

In the present invention, a three-dimensional device may be produced by transferring at least one layer among a plurality of transferred layers (thin film device layers) in the three-dimensional device by the above-mentioned transfer process (transfer technology) of the thin film configuration.

The transfer process in the present invention is not limited to the above-described method.

Industrial Applicability

In accordance with the method for making a three-dimensional device of the present invention, as described above, since thin film device layers are deposited by a transfer process, the three-dimensional device, for example, a three-dimensional IC is readily produced.

In particular, wide ranges of production conditions can be selected without considering adverse effects on the underlying layers (underlying thin film device layers), unlike in conventional processes, because individual thin film device layers can be independently produced.

Since a plurality of thin film device layers is deposited in the production of the device in the present invention, integration density is increased.

Since individual thin film device layers are formed on different substrates in the present invention, each thin film device layer can be formed by optimized device parameters, and the resulting device has high reliability and high performance.

Since only nondefective units are selected in deposition of each thin film device layer, the product yield is improved compared to production of three-dimensional devices by deposition of each layer on the same substrate (direct formation of each layer).

What is claimed is:

1. A method for making a device having a plurality of layers, comprising:
    forming a cleaving layer over a first substrate;
    forming at least one layer over the cleaving layer, the at least one layer having a predetermined pattern; and
    transferring partly the at least one layer to a second substrate by a step including irradiating the cleaving layer with a light having the predetermined pattern.

2. A method for making a device having a plurality of layers, comprising:
    forming a cleaving layer over a first substrate;
    forming at least one layer over the cleaving layer, the at least one layer having a predetermined pattern; and
    transferring partly the at least one layer to a second substrate by a step including forming a cleavage of the cleaving layer so that the cleavage has the predetermined pattern, the at least one layer having a pattern corresponding to the predetermined pattern when the at least one layer is disposed over the second substrate.

3. The method for making a device according to claim 1, the cleaving layer including any one of amorphous silicon, ceramic, metal and an organic material.

4. The method for making a device according to claim 1, the cleavage of the cleaving layer being generated by one of breakage and attenuation of atomic bonding force or molecular bonding force of substances comprising the cleaving layer.

5. The method for making a device according to claim 1, the cleavage of the cleaving layer being generated by gas evolved from substances comprising the cleaving layer.

6. The method for making a device according to claim 1, wherein laser light is used for-light-irradiation.

7. The method for making a device according to claim 6, the laser light having a wavelength of 100 to 350 nm.

8. The method for making a device according to claim 6, the laser light having a wavelength of 350 to 1,200 nm.

9. The method for making a device according to claim 1, the first substrate being an optically transparent substrate.

10. The method for making a device according to claim 2, the plurality of layers further comprising electrodes that electrically connect two adjacent layers.

11. The method for making a device according to claim 10, the electrodes being disposed on two surfaces of each layer.

12. The method for making a device according to claim 10, further comprising bonding the two adjacent layers to each other with an anisotropic conductive film therebetween.

13. The method for making a device according to claim 2, in two selected layers of the layers, a first of the two selected layers comprising a light emitting section and a second of the two selected layers comprising a light receiving section that receives light from the light emitting section, and the light emitting section and the light receiving section enabling optical communication between the two selected layers.

14. The method for making a device according to claim 2, the at least one layer being simultaneously produced with at least one layer of the plurality of layers.

15. A method for making a device having a plurality of layers, comprising:
    forming a cleaving layer over a first substrate;
    forming at least one layer over the cleaving layer, the at least one layer including a plurality of transistors, the at least one layer having a predetermined pattern; and
    transferring partly the at least one layer to a second substrate by a step including forming a cleavage of the cleaving layer so that the cleavage has the predetermined pattern, the at least one layer having a pattern corresponding to the predetermined pattern when the at least one layer is disposed above the second substrate.

16. The method for making a device according to claim 2, the at least one layer including a memory device.

17. The method for making a device according to claim 2, the at least one layer including a logic device.

18. A method for making an LSI, comprising:
    forming a cleaving layer over a first substrate;
    forming at least two layers over the cleaving layer, the at least two layers including a memory device and a logic device, respectively, the at least two layer having a predetermined pattern; and
    transferring partly the at least two layers to a second substrate by a step including forming a cleavage of the cleaving layer so that the cleavage has the predetermined pattern, the at least two layers having a pattern corresponding to the predetermined pattern when the at least two layers are disposed over the second substrate.

19. The method for making a device according to claim 18, the logic device and the memory device being formed by different design rules.

20. The method for making a device according to claim 18, the logic and the memory being formed by different design parameters.

21. The method for making a device according to claim 18, the logic and the memory being formed by different production processes.

22. The method for making a device according to claim 2, the cleaving layer comprising at least one of amorphous silicon, ceramic, metal and an organic polymer.

23. The method for making a device according to claim 2, the plurality of layers including a layer having a light emitting section.

24. The method for making a device according to claim 1, the at least one layer including a memory device.

25. The method for making a device according to claim 1, the at least one device layer including a logic device.

26. A method for making a device having a plurality of layers including at least one device layer where a device is disposed, comprising:

forming a cleaving layer over a first substrate;

forming at least one layer over the cleaving layer, the at least one layer having a predetermined pattern; and transferring partly the at least one layer to the second substrate so that the at least one layer has the predetermined pattern when the at least one layer is disposed over the second substrate.

27. A method for making a device having a plurality of layers, comprising:

forming a cleaving layer having a predetermined pattern on a first substrate;

forming at least one layer on the cleaving layer, the at least one layer having the predetermined pattern; and transferring the at least one layer to a second substrate by a step including forming a cleavage of the cleaving layer so that the at least one layer has a pattern corresponding to the predetermined pattern when the at least one layer is disposed over the second substrate.

28. A method for making a device having a plurality of layers, comprising:

forming a cleaving layer on a first substrate;

forming at least one layer on the cleaving layer, the at least one layer having a predetermined pattern; and transferring partly the at least one layer to a second substrate by a step including irradiating the cleaving layer with a light through a mask having the predetermined pattern.

29. A method for making a device having a plurality of layers, comprising:

forming a cleaving layer over a first substrate;

forming at least one layer over the cleaving layer;

etching the cleaving layer to have a predetermined pattern; and transferring the at least one layer to a second substrate, the at least one layer having a pattern corresponding to the predetermined pattern when the at least one layer is deposited over the second substrate.

* * * * *